(12) United States Patent
Kusumi

(10) Patent No.: US 7,362,001 B2
(45) Date of Patent: Apr. 22, 2008

(54) GENERATOR-MOTOR

(75) Inventor: Hidetoshi Kusumi, Brussels (BE)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 413 days.

(21) Appl. No.: 10/530,288

(22) PCT Filed: Sep. 9, 2003

(86) PCT No.: PCT/JP03/11524

§ 371 (c)(1),
(2), (4) Date: Apr. 5, 2005

(87) PCT Pub. No.: WO2004/038896

PCT Pub. Date: May 6, 2004

(65) Prior Publication Data

US 2006/0087181 A1  Apr. 27, 2006

(30) Foreign Application Priority Data

| Oct. 28, 2002 | (JP) | ............................. 2002-313009 |
| Oct. 29, 2002 | (JP) | ............................. 2002-313924 |
| Oct. 29, 2002 | (JP) | ............................. 2002-313925 |
| Jul. 29, 2003 | (JP) | ............................. 2003-203214 |

(51) Int. Cl.
*H02K 23/52* (2006.01)
(52) U.S. Cl. ...................................................... 290/31
(58) Field of Classification Search ................... 290/31
See application file for complete search history.

(56) References Cited

U.S. PATENT DOCUMENTS

| 4,232,238 A | 11/1980 | Saito et al. |
| 4,797,602 A | 1/1989 | West |
| 4,799,309 A | 1/1989 | Cinzori et al. |
| 5,686,780 A | 11/1997 | Adachi et al. |
| 5,694,313 A | 12/1997 | Ooiwa |
| 5,705,902 A * | 1/1998 | Merritt et al. ............... 318/254 |
| 5,742,498 A | 4/1998 | Taniguchi et al. |
| 6,002,219 A * | 12/1999 | Permuy ....................... 318/139 |
| 6,538,356 B1 | 3/2003 | Jones |
| 6,713,888 B2 * | 3/2004 | Kajiura ...................... 290/40 F |
| 6,725,821 B2 * | 4/2004 | Warren et al. ........... 123/179.3 |
| 6,768,278 B2 | 7/2004 | Xu et al. |

(Continued)

FOREIGN PATENT DOCUMENTS

JP  A 56-081069  7/1981

(Continued)

OTHER PUBLICATIONS

U.S. Appl. No. 10/523,921, filed Feb. 7, 2005, Kusumi.

*Primary Examiner*—Joseph Waks
(74) *Attorney, Agent, or Firm*—Oliff & Berridge, PLC

(57) ABSTRACT

A generator-motor includes a control circuit. The control circuit is provided on an end surface of a motor. The control circuit includes a Zener diode, a capacitor, a U-phase arm, a V-phase arm, and a W-phase arm. The Zener diode, the capacitor, the U-phase arm, the V-phase arm, and the W-phase arm are connected in parallel between a positive bus and a negative bus. The Zener diode absorbs a surge voltage applied to the capacitor, the U-phase arm, the V-phase arm, and the W-phase arm.

5 Claims, 14 Drawing Sheets

U.S. PATENT DOCUMENTS

| | | |
|---|---|---|
| 6,806,671 B2 * | 10/2004 | Kusaka et al. ............... 318/442 |
| 6,882,047 B2 | 4/2005 | Hata et al. |
| 6,882,072 B2 | 4/2005 | Wingett et al. |
| 6,977,453 B2 | 12/2005 | Yoda et al. |
| 6,979,927 B2 | 12/2005 | Kometani et al. |
| 2002/0158523 A1 | 10/2002 | Abadia et al. |

FOREIGN PATENT DOCUMENTS

| | | |
|---|---|---|
| JP | A 58-079668 | 5/1983 |
| JP | A 61-240666 | 10/1986 |
| JP | A 62-268370 | 11/1987 |
| JP | A 63-202255 | 8/1988 |
| JP | A 02-266855 | 10/1990 |
| JP | U 03-111184 | 11/1991 |
| JP | A 04-011757 | 1/1992 |
| JP | A 05-067889 | 3/1993 |
| JP | 06062553 A * | 3/1994 |
| JP | A 08-084439 | 3/1996 |
| JP | A 09-143649 | 6/1997 |
| JP | A 10-056762 | 2/1998 |
| JP | A 11-235051 | 8/1999 |
| JP | A 11-284122 | 10/1999 |
| JP | A 2001-268924 | 9/2001 |
| JP | A 2001-270401 | 10/2001 |
| JP | A 2002-153030 | 5/2002 |

* cited by examiner

F I G. 1 0
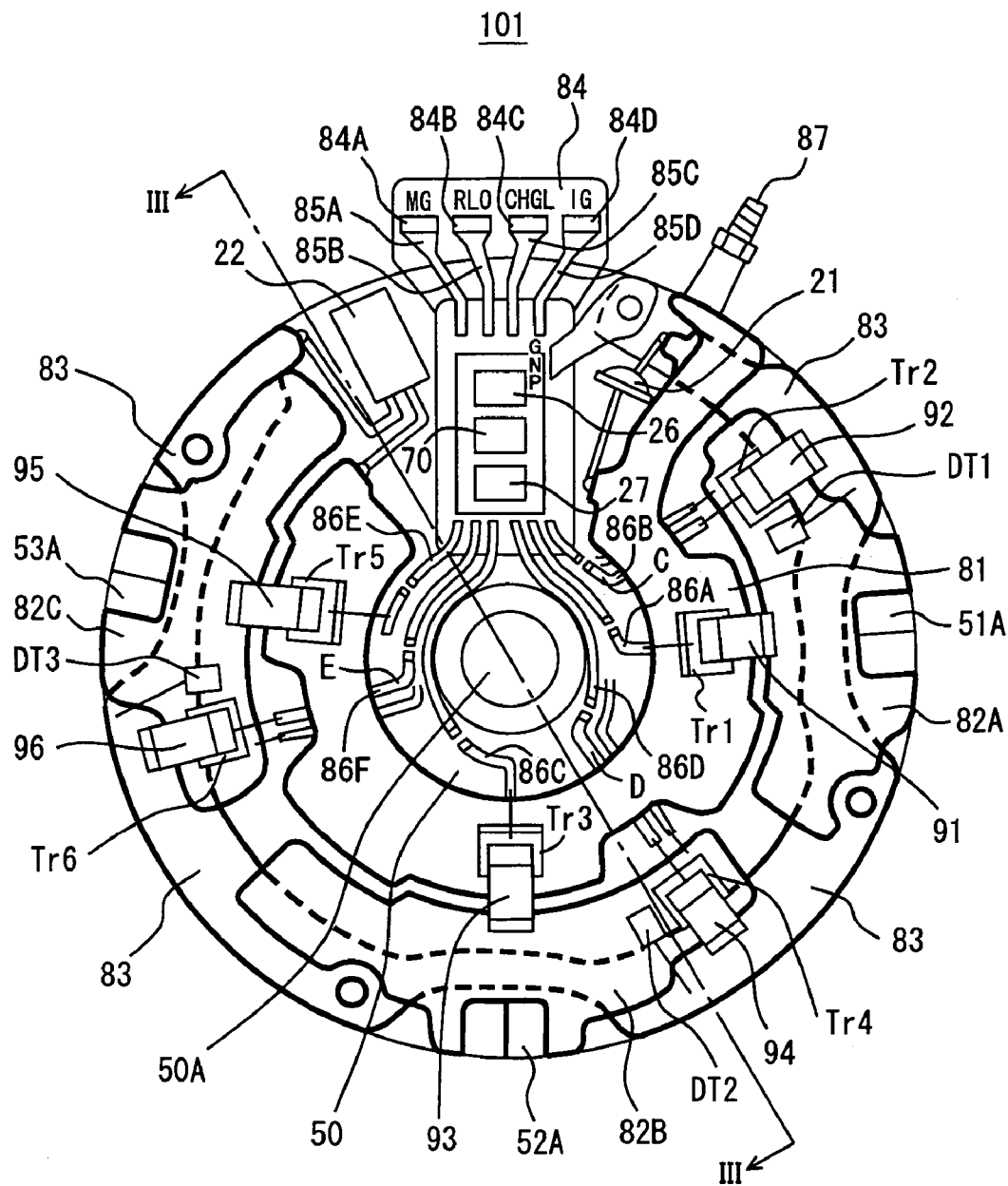

GENERATOR-MOTOR

TECHNICAL FIELD

The present invention relates to a generator-motor attaining a function as a generator and a motor, that can be reduced in size.

BACKGROUND ART

Japanese Patent Laying-Open No. 2-266855 discloses a starter-generator attaining a function as a three-phase motor starting an engine mounted on a vehicle and a function as a three-phase AC generator charging a battery.

Referring to FIG. 14, a starter-generator 300 disclosed in Japanese Patent Laying-Open No. 2-266855 includes a motor unit 301 and a drive unit 302. Motor unit 301 includes a stator and a rotor. Drive unit 302 is provided on an end surface 301A of motor unit 301. Drive unit 302 includes a cylindrical member 302A and a power module 302B. Power module 302B is formed on a surface of cylindrical member 302A. That is, power module 302B is arranged in a direction perpendicular to a radial direction 303 of cylindrical member 302A and in a longitudinal direction 304 of a rotation shaft 301B of motor unit 301.

Power module 302B feeds a current to a coil included in motor unit 301 and drives motor unit 301 so that the rotor outputs a prescribed torque. When the rotor in motor unit 301 rotates by rotation power of an engine, an AC voltage induced in three stators is converted to a DC voltage, whereby a battery is charged.

In this manner, power module 302B is provided on end surface 301A of motor unit 301, and drives motor unit 301 as a motor or a generator.

Japanese Patent Laying-Open No. 63-202255 discloses a starter-charger starting an engine mounted on a vehicle and charging a battery. FIG. 15 is a circuit diagram of the starter-charger disclosed in Japanese Patent Laying-Open No. 63-202255. Referring to FIG. 15, a starter-charger 400 includes a battery 310, a key switch 320, a voltage regulator 330, a field coil 340, a crank angle detector 350, an armature current switching circuit 360, and an armature coil 380.

Battery 310 outputs a DC voltage. Key switch 320 is connected to an e terminal side at the time of start of the engine (not shown), and connected to a d terminal side after the start of the engine.

Voltage regulator 330 includes resistors 331 to 333, a Zener diode 334, transistors 335, 337, and a flywheel diode 336. Resistors 331, 332 are connected in series between a positive bus PLE of battery 310 and a ground node GND.

Resistor 333 and transistor 335 are connected in series between the d terminal of key switch 320 and ground node GND. Transistor 335 has the collector connected to resistor 333 and the base of transistor 337, the emitter connected to ground node GND, and the base connected to Zener diode 334.

Zener diode 334 is connected between a node N1 and the base of transistor 335. Flywheel diode 336 and transistor 337 are connected in series between positive bus PLE and ground node GND. Transistor 337 has the collector connected to one end of field coil 340, the emitter connected to ground node GND, and the base connected to the collector of transistor 335.

Flywheel diode 336 absorbs surge produced when transistor 337 opens or closes.

Field coil 340 has one end connected to the collector of transistor 337 and the other end connected to positive bus PLE of battery 310.

With such a circuit configuration, voltage regulator 330 detects a DC voltage output from battery 310 in a power generation state, and regulates a field current flowing through field coil 340 in order to maintain a voltage value of the detected DC voltage at a prescribed value.

Crank angle detector 350 detects a crank angle between respective phases of armature coil 380, and outputs the detected crank angle to armature current switching circuit 360.

Armature current switching circuit 360 includes a current switch control circuit 361, N-type MOS transistors 362 to 367, and Zener diodes 368 to 373. Current switch control circuit 361 is connected to the e terminal of key switch 320, and receives a crank angle from crank angle detector 350. Current switch control circuit 361 is driven by the DC voltage from the e terminal so as to generate a signal to turn on/off N-type MOS transistors 362 to 367 based on the crank angle, and outputs the generated signal to each of N-type MOS transistors 362 to 367.

N-type MOS transistors 362, 363 are connected in series between positive bus PLE and ground node GND. N-type MOS transistors 364, 365 are connected in series between positive bus PLE and ground node GND. N-type MOS transistors 366, 367 are connected in series between positive bus PLE and ground node GND.

N-type MOS transistors 362, 363 are connected between positive bus PLE and ground node GND, in parallel to N-type MOS transistors 364, 365 and N-type MOS transistors 366, 367. In addition, N-type MOS transistors 362, 364, 366 have respective drain terminals connected to positive bus PLE, and have source terminals connected to the drain terminals of N-type MOS transistors 363, 365, 367 respectively. Moreover, N-type MOS transistors 363, 365, 367 have the drain terminals connected to source terminals of N-type MOS transistors 362, 364, 366 respectively, and have respective source terminals connected to ground node GND.

A node N2 between N-type MOS transistor 362 and N-type MOS transistor 363, a node N3 between N-type MOS transistor 364 and N-type MOS transistor 365, and a node N4 between N-type MOS transistor 366 and N-type MOS transistor 367 are connected to different phases of armature coil 380 respectively.

Zener diode 368 is connected in parallel to N-type MOS transistor 362, between positive bus PLE and node N2. Zener diode 369 is connected in parallel to N-type MOS transistor 363, between node N2 and ground node GND.

Zener diode 370 is connected in parallel to N-type MOS transistor 364, between positive bus PLE and node N3. Zener diode 371 is connected in parallel to N-type MOS transistor 365, between node N3 and ground node GND.

Zener diode 372 is connected in parallel to N-type MOS transistor 366, between positive bus PLE and node N4. Zener diode 373 is connected in parallel to N-type MOS transistor 367, between node N4 and ground node GND.

With such a circuit configuration, armature current switching circuit 360 switches a DC current flowing from battery 310 to armature coil 380.

When the engine is started, key switch 320 is connected to the e terminal. Armature current switching circuit 360 turns on/off N-type MOS transistors 362 to 367 based on the crank angle from crank angle detector 350 and switches the DC current flowing from battery 310 to armature coil 380, so as to start the engine.

After the engine is started, key switch 320 is connected to the d terminal, and N-type MOS transistors 362 to 367 are all turned off. Starter-charger 300 operates as a generator, and voltage regulator 330 regulates a current fed to field coil 340 in order to set a voltage value of the DC voltage from battery 310 to a prescribed value. Electric power generated by armature coil 380 is DC-converted by Zener diodes 368 to 373 for charging battery 310.

In this manner, starter-charger 300 drives the engine in starting the engine, and operates as a generator after the engine is started. Even if surge produced in cutting off load or surge produced in an ignition system of the engine is applied to armature current switching circuit 360, the applied surge flows through Zener diodes 368 to 373. Therefore, N-type MOS transistors 362 to 367 are protected by Zener diodes 368 to 373.

In the conventional starter-generator, however, the power module is arranged in a direction perpendicular to a radial direction when the rotation shaft is assumed as a center and in a longitudinal direction of the rotation shaft. Accordingly, it is difficult to achieve a smaller size of the control circuit controlling drive of the motor.

In addition, the conventional starter-generator has not been able to sufficiently cool the power module.

Moreover, in the conventional starter-charger, the control circuit driving a motor including the field coil and the armature coil includes six switching elements and six Zener diodes provided corresponding to six switching elements. Accordingly, if the control circuit driving the motor is provided at an end portion of an alternator, an overall size of the control circuit cannot be made smaller.

DISCLOSURE OF THE INVENTION

From the foregoing, an object of the present invention is to provide a generator-motor including a compact control circuit.

Another object of the present invention is to provide a generator-motor including a control circuit occupying a smaller area.

Yet another object of the present invention is to provide a generator-motor attaining an effect to cool a switching element.

According to the present invention, a generator-motor includes a motor and a control circuit. The motor includes a plurality of coils provided corresponding to a plurality of phases and attains a function as a generator-motor. The control circuit controls the motor.

The control circuit includes a plurality of arms and a first Zener diode. The plurality of arms are provided corresponding to the plurality of coils respectively and connected in parallel between a positive bus and a negative bus. The first Zener diode is connected in parallel to the plurality of arms, between the positive bus and the negative bus.

Each of the plurality of arms includes first and second switching elements and a second Zener diode. The first and second switching elements are connected in series between the positive bus and the negative bus. The second Zener diode is connected in parallel to the second switching element, between the first switching element and the negative bus.

Preferably, the control circuit is provided in a manner integrated with the motor.

Preferably, the motor starts an engine mounted on a vehicle or generates electric power by a rotation force of the engine.

Preferably, the generator-motor further includes an electronic control unit. The electronic control unit outputs a control signal to a plurality of first and second switching elements included in the control circuit. The first Zener diode is arranged in the vicinity of the electronic control unit.

Preferably, the generator-motor further includes a fuse. The fuse is provided closer to a DC power source than to a positive-side connecting position of the first Zener diode.

According to the present invention, a generator-motor includes a motor, a polyphase switching element group, a control circuit, and first and second electrode plates. The motor includes a rotor and a stator, and attains a function as a generator-motor. The polyphase switching element group controls a current supplied to a stator. The control circuit controls the polyphase switching element group. The first and second electrode plates are arranged on an end surface of the motor so as to substantially form a U-shape to surround a rotation shaft of the motor. The control circuit is provided on a ceramic substrate arranged in a direction similar to an inplane direction of the first and second electrode plates in a substantially U-shaped notch.

Preferably, the control circuit is resin-molded.

Preferably, the generator-motor further includes a Zener diode. The Zener diode protects the polyphase switching element group against surge. The Zener diode is arranged in the notch.

Preferably, the generator-motor further includes a capacitive element. The capacitive element smoothes a DC voltage from a DC power source and supplies the smoothed DC voltage to the polyphase switching element. The capacitive element is arranged between the ceramic substrate and the second electrode plate.

Preferably, the generator-motor further includes a field coil control unit. The field coil control unit controls current feed to the field coil different from the stator. The field coil control unit is arranged on the ceramic substrate.

Preferably, a leadframe continuing to the first and second electrode plates from the ceramic substrate and the first and second electrode plates are provided in an identical plane.

According to the present invention, a generator-motor includes a motor, a plurality of switching elements, and a bus bar. The motor attains a function as a generator and/or a motor. The plurality of switching elements control a current supplied to the motor. The bus bar connects the plurality of switching elements. A ratio of an area of the bus bar to an area of the switching element is five or more.

Preferably, the generator-motor further includes a buffer material. The buffer material is provided between the bus bar and the switching element and absorbs thermal expansion difference between the bus bar and the switching element.

Preferably, the buffer material is made of a copper-based or aluminum-based material.

Preferably, the bus bar is made of copper.

Preferably, the bus bar is provided on an end surface of the motor and has an arc shape.

Preferably, the bus bar includes first to third bus bars. The first bus bar implements a power source line. The second bus bar is connected to a coil of the motor. The third bus bar implements a ground line. The plurality of switching elements include a plurality of first switching elements and a plurality of second switching elements. The plurality of first switching elements are provided on the first bus bar. The plurality of second switching elements are provided on the second bus bar. The generator-motor further includes first and second flat electrodes. The first flat electrode connects the plurality of first switching elements to the second bus bar. The second flat electrode connects the plurality of second switching elements to the third bus bar.

According to the generator-motor of the present invention, the first Zener diode protects the first switching elements included in respective ones of the plurality of arms. That is, according to the generator-motor of the present invention, one Zener diode protects a plurality of switching elements.

Therefore, according to the present invention, a control circuit controlling the motor can be made smaller. As a result, the control circuit can be provided on the end surface of the motor.

In addition, according to the generator-motor of the present invention, the control circuit controlling drive of the motor attaining a function as a generator or a motor is arranged in a direction similar to an inplane direction of the first and second electrode plates arranged on the end surface of the motor. The control circuit is arranged in the substantially U-shaped notch in the first and second electrode plates.

Therefore, according to the present invention, an area occupied by the control circuit can be reduced.

Moreover, according to the generator-motor of the present invention, the plurality of switching elements controlling a current fed to the stator of the motor are fixed to the bus bar, with the buffer material composed of a material the same as that for the bus bar being interposed. Then, heat generated in the plurality of switching elements is transmitted to the bus bar through the buffer-material or both the buffer material and the flat electrode.

Furthermore, according to the generator-motor of the present invention, a ratio between an area of the bus bar and an area of the switching element controlling a current fed to the stator of the motor is set to be not smaller than 5.

Therefore, according to the present invention, the switching element can effectively be cooled.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is another plan view of the generator-motor according to the present invention.

BEST MODES FOR CARRYING OUT THE INVENTION

Figure 1:
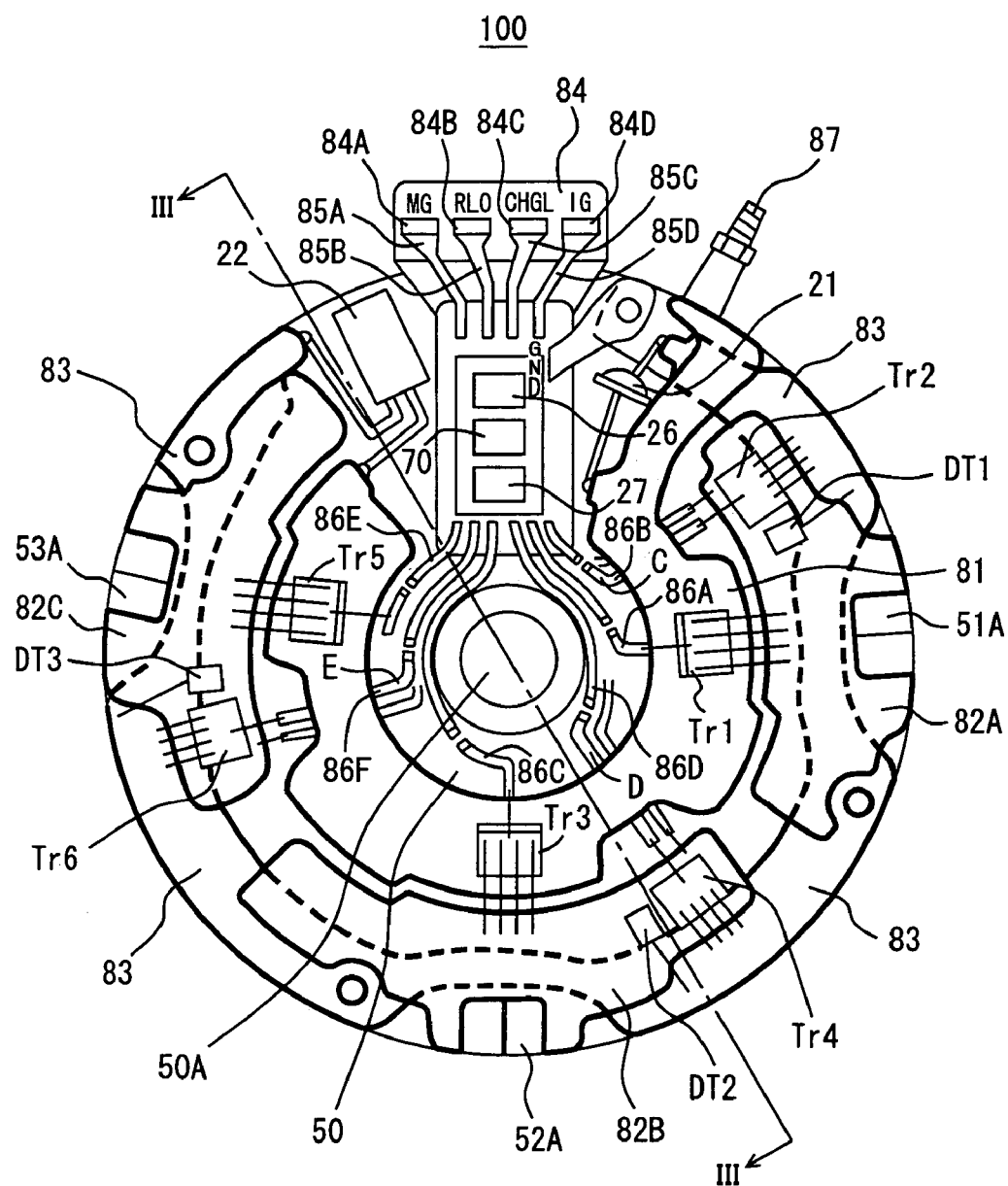
FIG. 1 is a plan view of a generator-motor according to the present invention.

In the following, embodiments of the present invention will be described in detail with reference to the figures. It is noted that the same reference characters refer to the same or corresponding components in the figures, and description thereof will not be repeated.

Referring to FIG. 1, a generator-motor 100 according to the present invention includes Zener diodes 21, DT1 to DT3, MOS transistors Tr1 to Tr6, a power source 26, a MOS driver 27, an alternator 50, a custom IC 70, electrode plates 81, 82A to 82C, 83, a substrate 84, terminals 84A to 84D, and wires 85A to 85D, 86A to 86D.

In the following, description will be provided, assuming that generator-motor 100 is mounted on an automobile adopting what is called an "eco-run" (an economy running system or an idle stop system) in which an engine is controlled so as to automatically stop when a vehicle is stopped and is automatically started at the time of re-start of the vehicle.

Electrode plates 81, 82A to 82C, 83 and substrate 84 are formed on an end surface of alternator 50. Electrode plates 81, and 82A to 82C are made of copper (Cu). Electrode plate 81 has a substantial U-shape (hereinafter, also referred to as an "arc shape"), and is provided around a rotation shaft 50A of alternator 50. Electrode plates 82A to 82C are provided outside electrode plate 81 so as to surround the same. Electrode plates 82A to 82C are arranged at prescribed intervals from each other. Electrode plate 83 is arranged in a position at a distance from rotation shaft 50A substantially the same as the distance between electrode plates 82A-82C and rotation shaft 50A. A portion of electrode plate 83 is arranged under electrode plates 82A to 82C. Substrate 84 is arranged in a direction the same as an inplane direction of electrode plates 81, 82A to 82C, 83 in a substantially U-shaped notch in electrode plate 81.

MOS transistors Tr1, Tr3, Tr5 are arranged on electrode plate 81, MOS transistor Tr2 and Zener diode DT1 are arranged on electrode plate 82A, MOS transistor Tr4 and Zener diode DT2 are arranged on electrode plate 82B, and MOS transistor Tr6 and Zener diode DT3 are arranged on electrode plate 82C.

MOS transistor Tr1 has the drain connected to electrode plate 81 and the source connected to electrode plate 82A. MOS transistor Tr2 has the drain connected to electrode plate 82A and the source connected to electrode plate 83. Zener diode DT1 has one terminal connected to electrode plate 82A and the other terminal connected to electrode plate 83. Electrode plate 82A is connected to one end 51A of a U-phase coil of alternator 50.

MOS transistor Tr3 has the drain connected to electrode plate 81 and the source connected to electrode plate 82B, MOS transistor Tr4 has the drain connected to electrode plate 82B and the source connected to electrode plate 83.

Zener diode DT2 has one terminal connected to electrode plate 82B and the other terminal connected to electrode plate 83. Electrode plate 82B is connected to one end 52A of a V-phase coil of alternator 50.

MOS transistor Tr5 has the drain connected to electrode plate 81 and the source connected to electrode plate 82C. MOS transistor Tr6 has the drain connected to electrode plate 82C and the source connected to electrode plate 83. Zener diode DT3 has one terminal connected to electrode plate 82C and the other terminal connected to electrode plate 83. Electrode plate 82C is connected to one end 53A of a W-phase coil of alternator 50.

Therefore, MOS transistors Tr1, Tr2 are connected in series between electrode plates 81 and 83 through electrode plate 82A. In addition, MOS transistors Tr3, Tr4 are connected in series between electrode plates 81 and 83 through electrode plate 82B. Moreover, MOS transistors Tr5, Tr6 are connected in series between electrode plates 81 and 83 through electrode plate 82C. Electrode plates 82A to 82C are connected to the U-phase coil, the V-phase coil and the W-phase coil of alternator 50, respectively.

Substrate 84 is implemented by a ceramic substrate. Power source 26, custom IC 70, MOS driver 27, and terminals 84A to 84D are arranged on substrate 84. Power source 26, custom IC 70, and MOS driver 27 are resin-molded on substrate 84.

Terminal 84A receives a signal M/G and outputs received signal M/G to custom IC 70 through wire 85A. Terminal 84B receives a signal RLO, and outputs received signal RLO to custom IC 70 through wire 85B. Terminal 84C receives a signal CHGL, and outputs received signal CHGL to custom IC 70 through wire 85C. Terminal 84D receives a DC voltage output from battery 10 and supplies the received DC voltage to power source 26 through wire 85D.

In wiring from substrate 84 to electrode plates 81, 82A to 82C, wires 86A to 86F are arranged along a circumference surrounding rotation shaft 50A in a space between rotation shaft 50A and electrode plate 81. Then, wire 86B is bent at a point C, and extends under electrode plate 81 to reach electrode plate 82A. Wire 86D is bent at a point D, and extends under electrode plate 81 to reach electrode plate 82B. In addition, wire 86F is bent at a point E, and extends under electrode plate 81 to reach electrode plate 82C.

MOS driver 27 outputs a control signal to the gates of MOS transistors Tr1 to Tr6 through wires 86A to 86F, respectively.

Zener diode 21 is arranged in a space between substrate 84 and electrode plates 81, 83, and connected between electrode plates 81 and 83. A capacitor 22 is arranged in a space between substrate 84 and electrode plates 81, 82C, 83, and connected between electrode plates 81 and 83.

Electrode plate 81 attains a function as a positive bus which will be described later, and has one end connected to a terminal 87. Electrode plate 81 receives a DC voltage output from a DC power source through terminal 87. Electrode plate 83 attains a function as a negative bus which will be described later.

Figure 2A:
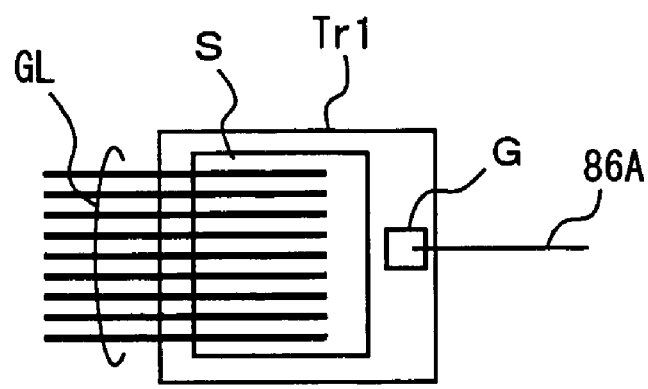
FIG. 2A is a plan view of a MOS transistor Tr1 shown in FIG. 1.
Figure 2B:
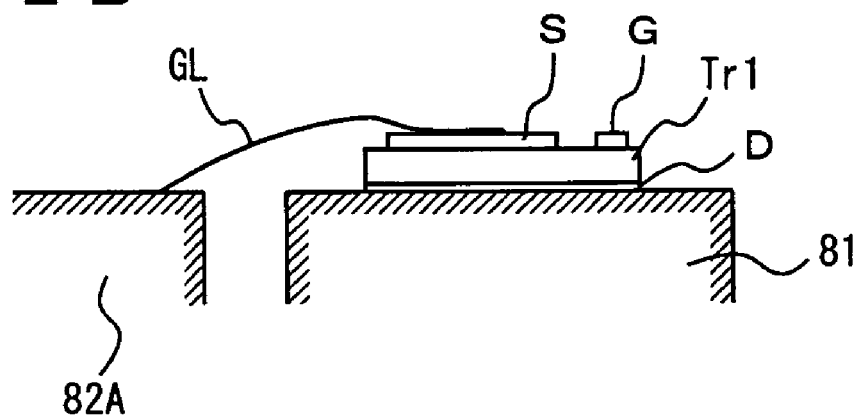
FIG. 2B is a cross-sectional view of MOS transistor Tr1 and electrode plates 81, 82A shown in FIG. 1.

FIG. 2A is a plan view of MOS transistor Tr1 shown in FIG. 1, and FIG. 2B is a cross-sectional view of MOS transistor Tr1 and electrode plates 81, 82A shown in FIG. 1. Referring to FIGS. 2A and 2B, MOS transistor Tr1 includes a gate G, a source S and a drain D. Gate G is connected to wire 86A. Source S is arranged adjacent to gate G, and connected to electrode plate 82A by a wire GL. Therefore, in order to facilitate connection of gate G and source S to wire 86A and electrode plate 82A through wire GL, respectively, MOS transistor Tr1 is arranged such that gate G is oriented to a side of rotation shaft 50A and source S is oriented to a side of electrode plate 82A. Drain D is connected to electrode plate 81.

Each of MOS transistors Tr2 to Tr6 includes a gate G, a source S and a drain D in a manner similar to MOS transistor Tr1, and arrangement thereof is also the same.

In a large power element such as MOS transistors Tr1 to Tr6, in many cases, gate G is provided in a central portion of one side along a peripheral portion of the element as described above, so that a length of a signal input line coming from the outside of the element is minimized and so that a pad for an output terminal is made as large as possible.

Therefore, if drain D of MOS transistors Tr1 to Tr6 is provided on a back surface of the element, wire GL from source S is provided such that it is drawn out of a side opposite to the side where gate G is present.

If MOS transistors Tr1 to Tr6 are arranged on electrode plates 81, 82A, 82B, 82C, in order to attain a shorter length of wires 86A, 86B, 86C, 86D, 86E, 86F, GL, MOS transistors Tr1 to Tr6 should be arranged such that gate G is oriented to the side of rotation shaft 50A and source S is oriented to the outer circumferential side.

Then, MOS transistors Tr1, Tr3, Tr5 constitute an upper arm of an inverter controlling a current fed to a coil of each phase of alternator 50, while MOS transistors Tr2, Tr4, Tr6 constitute a lower arm of the inverter controlling a current fed to a coil of each phase of alternator 50. Accordingly, considering a direction of arrangement of MOS transistors Tr1 to Tr6, arranging electrode plate 81 in an innermost portion and arranging electrode plates 82A, 82B, 82C, 83 outside electrode plate 81 is optimal, from a viewpoint of improved efficiency in cooling MOS transistors Tr1 to Tr6 (arranging MOS transistors Tr1 to Tr6 in an inner portion on the end surface of alternator 50 serves to cool MOS transistors Tr1 to Tr6 by a flow of air sucked from outside into alternator 50) or a shorter length of wires 86A, 86B, 86C, 86D, 86E, 86F, GL.

In addition, it is efficient to arrange electrode plate 83 on an outermost side, because electrode plate 83 implements a negative bus and can also be connected to a cover or a frame of alternator 50 for connection to ground.

For these reasons, electrode plate 81 is arranged in the innermost portion, and electrode plates 82A, 82B, 82C, 83 are arranged outside electrode plate 81.

Figure 3:
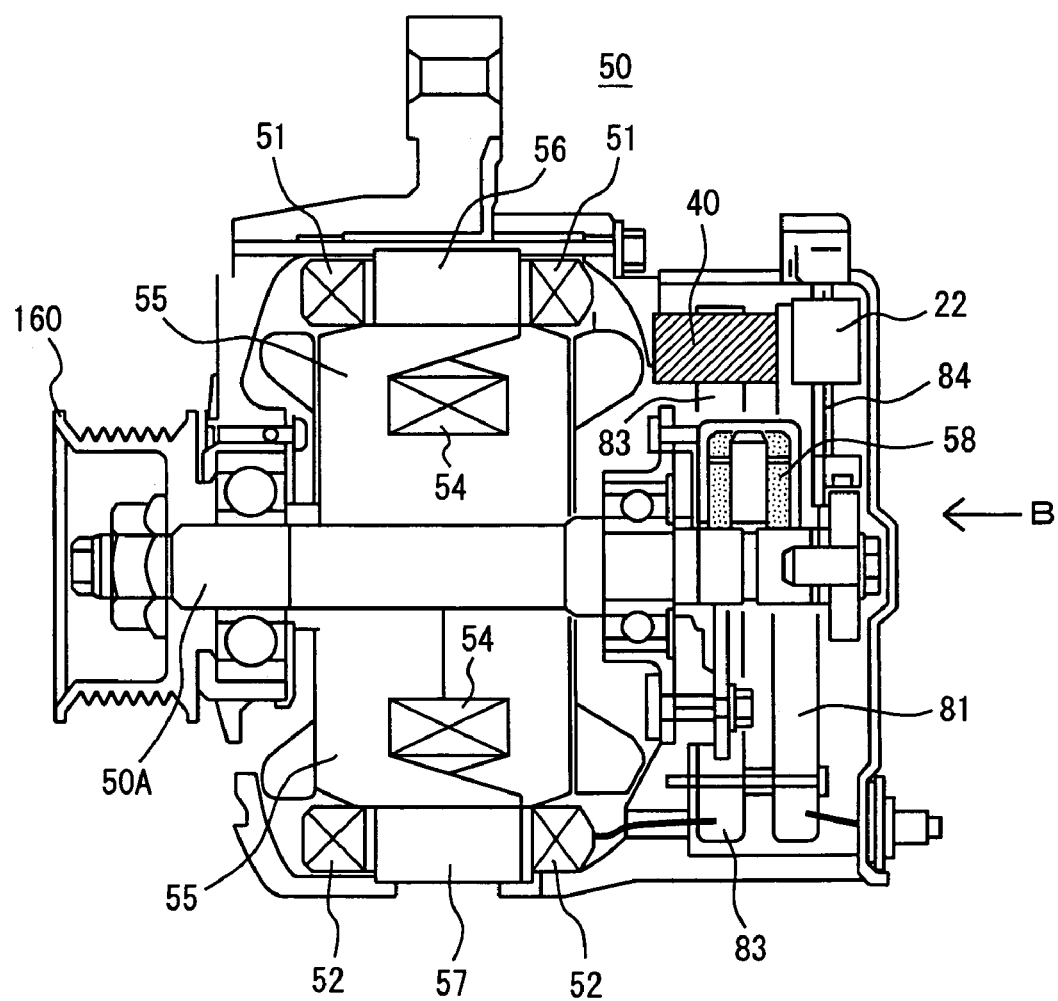
FIG. 3 is a cross-sectional view along the line III-III shown in FIG. 1.

FIG. 3 shows a cross-sectional structure of alternator 50, viewed from a cross-section along the line III-III shown in FIG. 1. Referring to FIG. 3, a rotor 55 is fixed to rotation shaft 50A, and a rotor coil 54 is wound around rotor 55. Stators 56, 57 are fixed on an outer side of rotor 55, a U-phase coil 51 is wound around stator 56, and V-phase coil 52 is wound around stator 57. In FIG. 3, the stator having a W-phase coil wound is not shown.

Rotation shaft 50A has one end connected to a pulley 160, which transmits a torque generated by alternator 50 to a crank shaft of the engine or auxiliary machinery through a belt and in turn transmits the rotation power of the crank shaft of the engine to rotation shaft 50A.

On the other end on a side opposite to one end of rotation shaft 50A connected to pulley 160, electrode plates 81, 83 are arranged so as to surround rotation shaft 50A. A brush 58 is arranged so as to be in contact with rotation shaft 50A. Substrate 84 is provided above rotation shaft 50A, and capacitor 22 is arranged in front of substrate 84.

A MOS transistor 40 is provided on a side opposite to capacitor 22, with electrode plate 81 lying therebetween. MOS transistor 40 has the drain connected to electrode plate 81 and the source connected to rotor coil 54. When alternator 50 generates electric power, a power generation amount is determined depending on a rotor current flowing in rotor coil 54. Therefore, MOS transistor 40 feeds rotor coil 54 with a rotor current necessary for alternator 50 to generate an instructed amount of electric power.

In this manner, MOS transistor 40 controlling the rotor current determining a power generation amount of alternator 50 is arranged on a back side of substrate 84 when viewed from a direction B.

Figure 4:
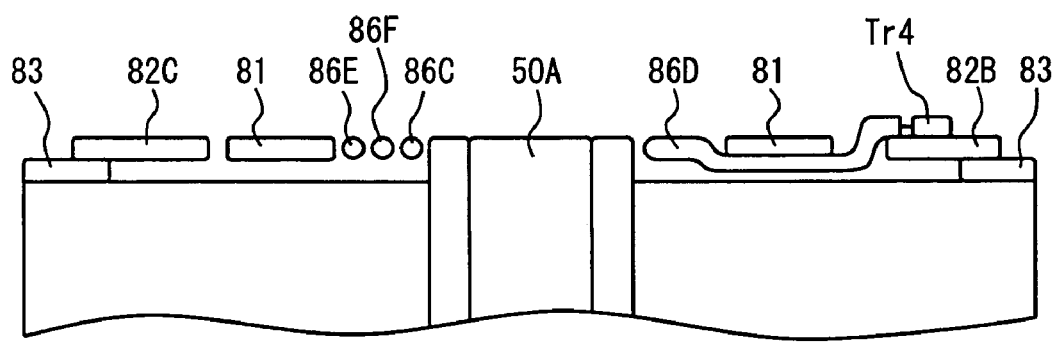
FIG. 4 is another cross-sectional view along the line III-III shown in FIG. 1.

FIG. 4 is a cross-sectional view showing an arrangement of electrode plates 81, 82B, 82C, 83 and the like viewed from the cross-section along the line III-III shown in FIG. 1. Referring to FIG. 4, wires 86C, 86E, 86F are arranged on the left of rotation shaft 50A, and electrode plates 81, 82C, 83 are successively arranged toward an outer circumferential side of wires 86C, 86E, 86F. Here, wires 86C, 86E, 86F and electrode plates 81, 82C are arranged in an identical plane. Electrode plate 83 is arranged below wires 86C, 86E, 86F and electrode plates 81, 82C, and electrode plate 83 partially overlaps with electrode plate 82C.

On the right of rotation shaft 50A, wire 86D and electrode plates 81, 82B, 83 are successively arranged. A portion of wire 86D and electrode plates 81, 82B are arranged in an identical plane. Electrode plate 83 is arranged below a portion of wire 86D and electrode plates 81, 82B, and electrode plate 83 partially overlaps with electrode plate 82B. MOS transistor Tr4 is arranged on electrode plate 82B. Wire 86D is arranged between rotation shaft 50A and electrode plate 81 so as to surround rotation shaft 50A until it reaches point D (see FIG. 1). After wire 86D is bent at point D, it extends under electrode plate 81 and is connected to the gate of MOS transistor Tr4.

Figure 5:
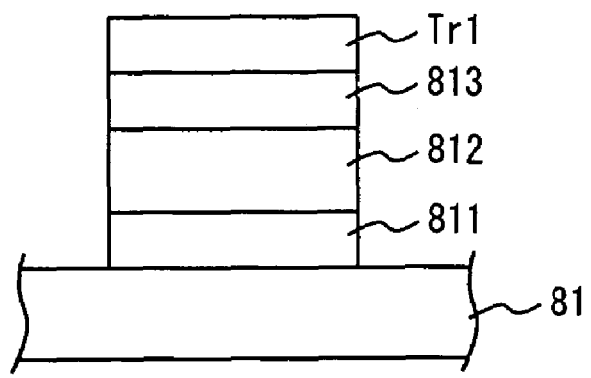
FIG. 5 is a cross-sectional view of an area of MOS transistor Tr1 shown in FIG. 1.

FIG. 5 is a cross-sectional view of an area where MOS transistor Tr1 shown in FIG. 1 is arranged. Referring to FIG. 5, a buffer material 812 is adhered to electrode plate 81 with a solder 811. Then, MOS transistor Tr1 is adhered to buffer material 812 with a solder 813. Buffer material 812 is made of copper (Cu) or a copper-based material such as copper-molybdenum or copper-tungsten, and has a thickness in a range from 0.1 to 2.0 mm. That is, buffer material 812 is made of a material the same as that for electrode plate 81. Solders 811, 813 are a Pb-free, Ag—Cu—Sn-based solder. Buffer material 812 absorbs a thermal expansion difference between electrode plate 81 and MOS transistor Tr1. Therefore, even if a temperature is increased due to an operation of MOS transistor Tr1 and electrode plate 81 and MOS transistor Tr1 expand, buffer material 812 prevents MOS transistor Tr1 from separating from electrode plate 81.

Figure 6:
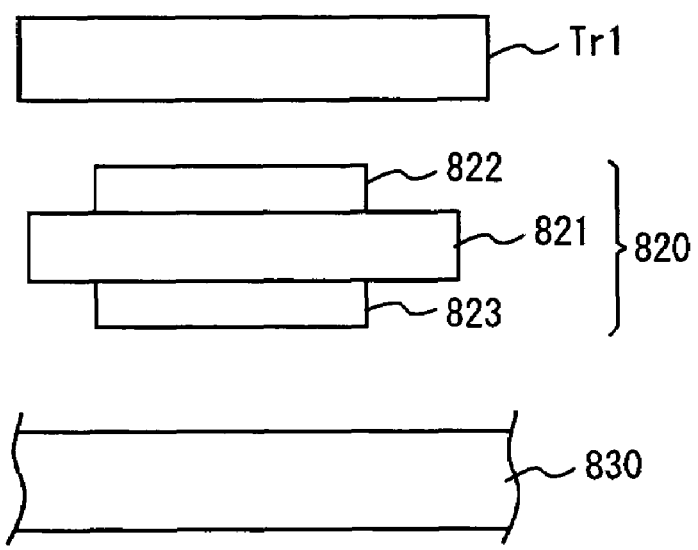
FIG. 6 is a cross-sectional view showing a conventional method of fixing an MOS transistor.

Referring to FIG. 6, conventionally, a mount portion of MOS transistor Tr1 has been constituted of a DBC (Direct Bond Copper) 820 and a heat sink 830 composed of AlSiC/CuMo or the like. DBC 820 is an insulating substrate having such a cross-sectional structure that copper (Cu) 822, 823 is formed on opposing sides of ceramics 821. MOS transistor Tr1 has been provided on heat sink 830 with DBC 820 being interposed. Alternatively, MOS transistor Tr1 has been provided on heat sink 830, with DBA (Direct Bond Aluminum) using aluminum (Al) instead of copper (Cu) in DBC 820 being interposed. When MOS transistor Tr1 is provided on heat sink 830 in such a manner, heat generated in MOS transistor Tr1 is less likely to be transmitted to heat sink 830, because ceramics 821 is an insulator. Consequently, MOS transistor Tr1 is not sufficiently cooled.

In contrast, as shown in FIG. 5, when MOS transistor Tr1 is directly provided on electrode plate 81 using buffer material 812 made of the material the same as that for electrode plate 81, solely metal is present between MOS transistor Tr1 and electrode plate 81. In addition, buffer material 812 and electrode plate 81 attain thermal conductivity higher than MOS transistor Tr1 composed of silicon (Si). Therefore, heat generated in MOS transistor Tr1 is likely to be transmitted to electrode plate 81 serving as the heat sink, and therefore, MOS transistor Tr1 is effectively cooled.

In this manner, the present invention is characterized in that MOS transistor Tr1 is provided on electrode plate 81 with buffer material 812 being interposed, buffer material 812 being made of the material the same as that for electrode plate 81 or of metal of a similar type. When buffer material 812 is made of the material the same as that for electrode plate 81 or of metal of a similar type, a thickness thereof is critical. Specifically, the thickness should be set in a range from 0.1 to 2.0 mm as described above, so as to attain a function as a buffer material.

Buffer material 812 may not be made of a material the same as that for electrode plate 81. For example, buffer material 812 may be made of aluminum (Al) instead of copper (Cu). In addition, buffer material 812 may be made of an aluminum-based material. In this case as well, buffer material 812 has a thickness in a range from 0.1 to 2.0 mm.

MOS transistors Tr2 to Tr6 are also fixed on electrode plates 81, 82A to 82C, in a manner similar to MOS transistor Tr1.

Figure 7:
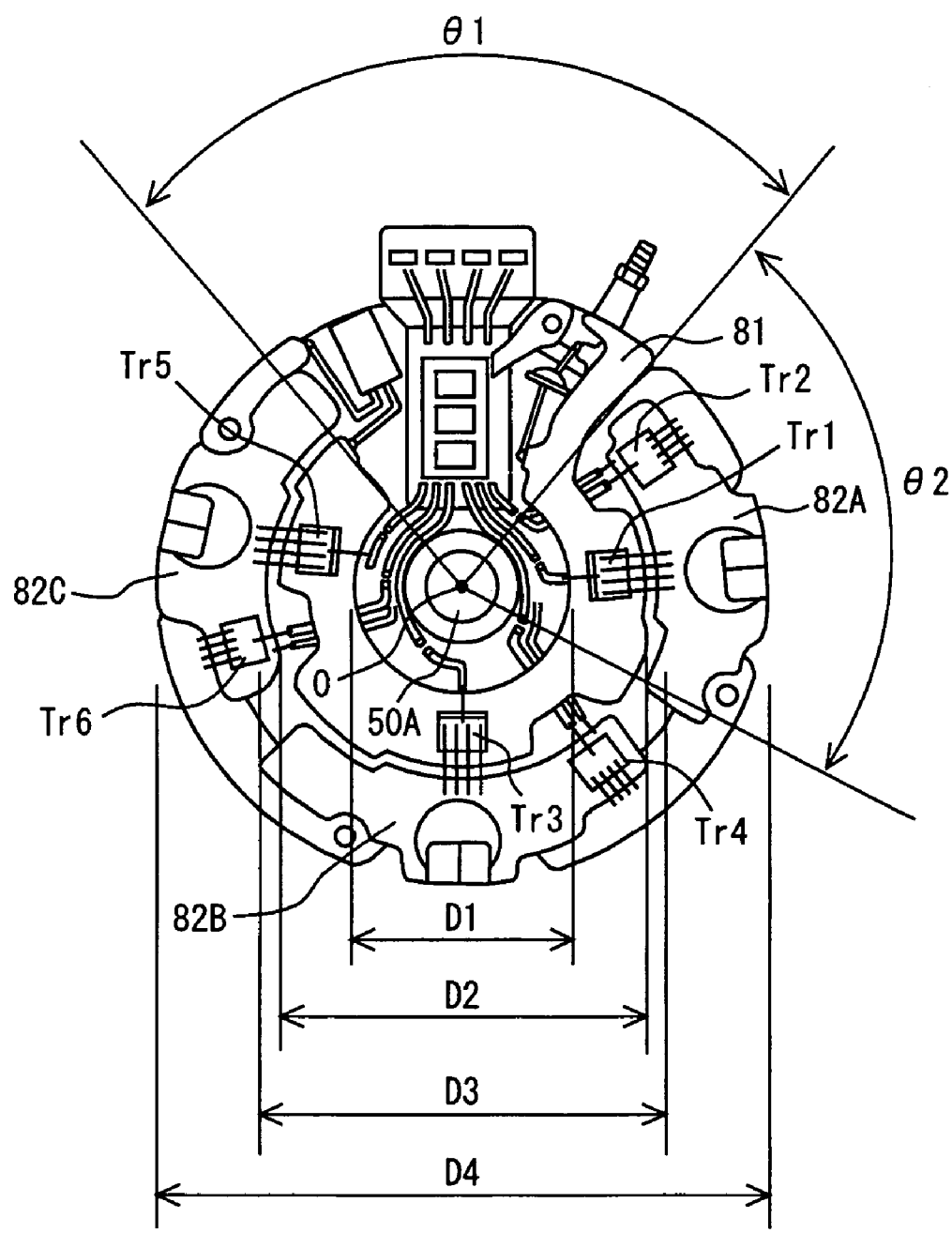
FIG. 7 is a plan view for calculating a ratio between an area of an electrode plate and an area of the MOS transistor.
Figure 8:
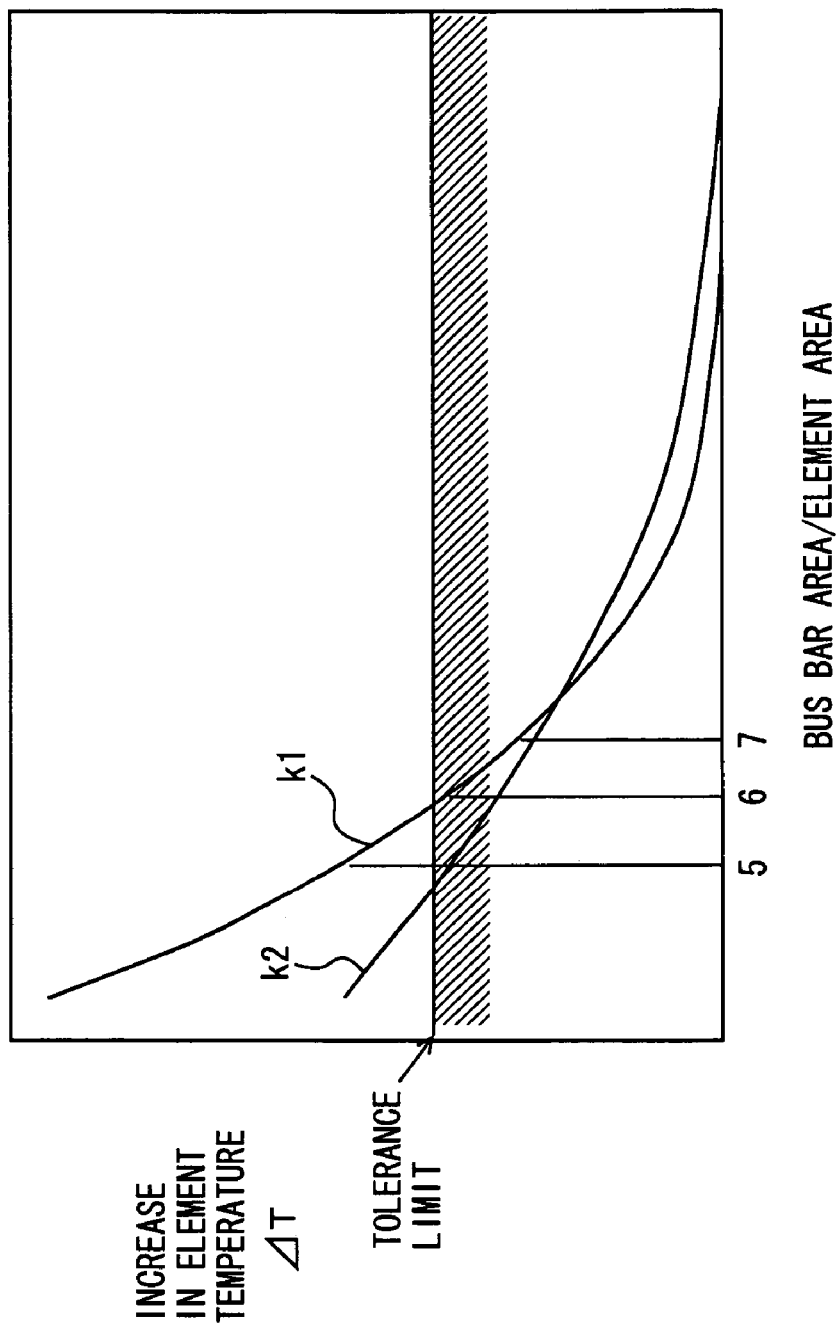
FIG. 8 shows a relation between increase in an element temperature and bus bar area/element area.

Referring to FIGS. 7 and 8, a ratio between an area of MOS transistors Tr1 to Tr6 and an area of electrode plates 81, 82A to 82C will be described. Referring to FIG. 7, a center of rotation shaft 50A of alternator 50 is denoted as O, and an angle defined by opposing ends of electrode plate 81 and center O is denoted as θ1. In addition, an angle defined by opposing ends of electrode plate 82A and center O is denoted as θ2.

An inner diameter of electrode plate 81 is denoted as D1, while an outer diameter of electrode plate 81 is denoted as D2. As electrode plates 82A to 82C are arranged in an arc shape (also referred to as "U shape") in a manner similar to electrode plate 81, an inner diameter of electrode plate 82A is denoted as D3, while an outer diameter of electrode plate 82A is denoted as D4.

In the present embodiment, a ratio between an area of MOS transistors Tr1 to Tr6 and an area of electrode plates 81, 82A to 82C was found, when MOS transistors Tr1 to Tr6 have a size fixed to 3 mm square, inner diameter D1 fixed to 40 mm, outer diameter D2 fixed to 70 mm, inner diameter D3 fixed to 75 mm, and outer diameter D4 fixed to 120 mm, angle θ1 is varied in a range from 80° to 150° while angle θ2 is varied in a range from 70° to 90°, and a temperature of MOS transistors Tr1 to Tr6 is not higher than a tolerance limit.

Table 1 shows an area of electrode plates 81, 82A when angle θ1 is set to 84° and angle θ2 is set to 78° as well as an area ratio between MOS transistors Tr1, Tr2 and electrode plates 81, 82A.

TABLE 1

|  |  |  | (mm²) |  |
| --- | --- | --- | --- | --- |
| Element |  | 9 * 9 | 81 |  |
|  |  |  | (mm²) | (times) |
| Bus Bar Diameter | 40 | Positive electrode | 520 | 6.4 |
|  | 70 |  |  |  |
|  | 75 | U phase | 760 | 9.4 |
|  | 120 |  |  |  |

In Table 1, "positive electrode" represents electrode plate 81, while an area of the positive electrode: 520 mm² represents an area of electrode plate 81 with respect to one MOS transistor Tr1. Here, the area of the positive electrode: 520 mm$^2$ is comparable to ⅓ of a total area of electrode plate 81.

Here, three MOS transistors Tr1, Tr3, Tr5 are provided on electrode plate 81. Accordingly, unless an area obtained by multiplying the total area of electrode plate 81 by ⅓ is used, an accurate ratio between an area of the electrode plate and an area of one MOS transistor cannot be obtained.

The "U-phase" in Table 1 represents electrode plate 82A.

The ratio between the area of MOS transistors Tr3, Tr5 and the area of electrode plate 81 is identical to a value shown with the positive electrode in Table 1. The ratio between an area of MOS transistor Tr4 and the area of electrode plate 82B as well as the ratio between an area of MOS transistor Tr6 and the area of electrode plate 82C are identical to the value shown with the U-phase in Table 1.

The area of electrode plates 81, 82A to 82C is calculated using the values described above. If the area of electrode plate 81 is 6.4 times larger than the area of MOS transistors Tr1, Tr3, Tr5, the temperature of MOS transistors Tr1 to Tr6 was not higher than the tolerance limit.

By reducing angle θ1 from 135°, the area of electrode plate 81 becomes larger. Meanwhile, by increasing angle θ2 from 75°, the area of electrode plate 82A becomes larger.

Accordingly, a relation between a ratio of the area of the MOS transistor to the area of the electrode plate and the temperature of MOS transistors Tr1 to Tr6 was examined, by varying angles θ1, θ2 so as to vary the area of electrode plates 81, 82A to 82C.

FIG. 8 shows a relation between increase in a temperature of MOS transistors Tr1 to Tr6 and bus bar area/element area. In FIG. 8, the ordinate represents increase in the element temperature, while the abscissa represents the bus bar area/element area. Here, the bus bar area represents the area of electrode plates 81, 82A to 82C. In addition, a curve k1 represents a transition state, that is, a motor operation state, while a curve k2 represents a power generation operation state.

Referring to FIG. 8, the temperature increase of MOS transistors Tr1 to Tr6 is greater in the motor operation state indicated by curve k1 than in the power generation operation state indicated by curve k2. Therefore, in the present invention, the area of MOS transistors Tr1 to Tr6 and the area of electrode plates 81, 82A to 82C are determined such that an area ratio not smaller than an area ratio at which the temperature increase in the element does not exceed the tolerance limit with respect to k1 is attained. In other words, the area of MOS transistors Tr1 to Tr6 and the area of electrode plates 81, 82A to 82C are determined such that an area ratio (=bus bar area/element area) is not smaller than 6.

In this manner, heat generated in MOS transistors Tr1 to Tr6 is transmitted to electrode plates 81, 82A to 82C through buffer material 812, and MOS transistors Tr1 to Tr6 are cooled so that the temperature increase in MOS transistors Tr1 to Tr6 does not exceed the tolerance limit.

Figure 9:
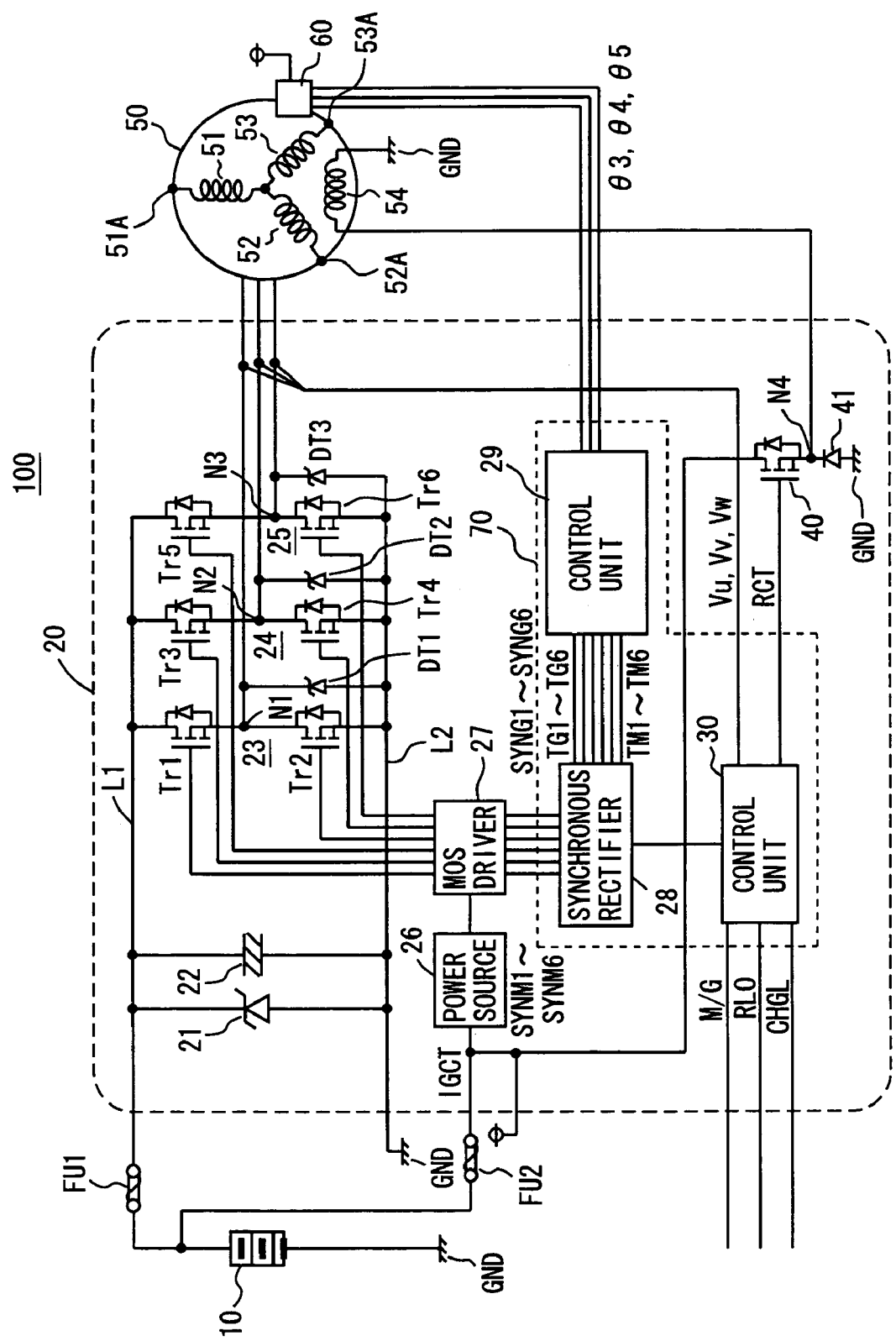
FIG. 9 is a circuit block diagram of the generator-motor and a battery shown in FIG. 1.

FIG. 9 is a circuit block diagram of generator-motor 100 and battery 10. A control circuit 20 includes Zener diode 21 arranged between substrate 84 and electrode plates 81, 83, capacitor 22 arranged between substrate 84 and electrode plates 81, 82C, 83, MOS transistors Tr1, Tr3, Tr5 arranged on electrode plate 81, MOS transistors Tr2, Tr4, Tr6 arranged on electrode plates 82A to 82C respectively, power source 26 arranged on substrate 84, MOS driver 27, custom IC 70, MOS transistor 40, and a diode 41.

MOS transistors Tr1, Tr2 constitute a U-phase arm 23, MOS transistors Tr3, Tr4 constitute a V-phase arm 24, and MOS transistors Tr5, Tr6 constitute a W-phase arm 25.

Custom IC 70 is constituted of a synchronous rectifier 28 and control units 29, 30. A rotation angle sensor 60 is contained in alternator 50.

Alternator 50 includes U-phase coil 51, V-phase coil 52, W-phase coil 53, and rotor coil 54. U-phase coil 51 has one end 51A connected to a node N1 between MOS transistor Tr1 and MOS transistor Tr2. V-phase coil 52 has one end 52A connected to a node N2 between MOS transistor Tr3 and MOS transistor Tr4. W-phase coil 53 has one end 53A connected to a node N3 between MOS transistor Tr5 and MOS transistor Tr6.

A fuse FU1 is connected between a positive electrode of battery 10 and control circuit 20. That is, fuse FU1 is arranged on a side of battery 10, rather than a side of Zener diode 21. In this manner, by arranging fuse FU1 on the side of battery 10 rather than the side of Zener diode 21, detection of overcurrent is no longer necessary and control circuit 20 can be reduced in size. A fuse FU2 is connected between the positive electrode of battery 10 and power source 26.

Zener diode 21 and capacitor 22 are connected in parallel between a positive bus L1 and a negative bus L2.

U-phase arm 23, V-phase arm 24, and W-phase arm 25 are connected in parallel between positive bus L1 and negative bus L2. U-phase arm 23 consists of MOS transistors Tr1, Tr2 and Zener diode DT1. MOS transistors Tr1, Tr2 are connected in series between positive bus L1 and negative bus L2. MOS transistor Tr1 has the drain connected to positive bus L1 and the source connected to node N1. MOS transistor Tr2 has the drain connected to node N1 and the source connected to negative bus L2. Zener diode DT1 is connected in parallel to MOS transistor Tr2, between node N1 and negative bus L2.

V-phase arm 24 consists of MOS transistors Tr3, Tr4 and Zener diode DT2. MOS transistors Tr3, Tr4 are connected in series between positive bus L1 and negative bus L2. MOS transistor Tr3 has the drain connected to positive bus L1 and the source connected to node N2. MOS transistor Tr4 has the drain connected to node N2 and the source connected to negative bus L2. Zener diode DT2 is connected in parallel to MOS transistor Tr4, between node N2 and negative bus L2.

W-phase arm 25 consists of MOS transistors Tr5, Tr6 and Zener diode DT3. MOS transistors Tr5, Tr6 are connected in series between positive bus L1 and negative bus L2. MOS transistor Tr5 has the drain connected to positive bus L1 and the source connected to node N3. MOS transistor Tr6 has the drain connected to node N3 and the source connected to negative bus L2. Zener diode DT3 is connected in parallel to MOS transistor Tr6, between node N3 and negative bus L2.

Zener diode 40 is connected between the positive electrode of battery 10 and a node N4. Diode 41 is connected between node N4 and ground node GND.

Here, diodes connected in parallel to MOS transistors Tr1 to Tr6, 40 respectively are parasitic diodes formed between MOS transistors Tr1 to Tr6, 40 and a semiconductor substrate respectively.

Battery 10 outputs, for example, a DC voltage of 12V. Zener diode 21 absorbs a surge voltage generated between positive bus L1 and negative bus L2. In other words, Zener diode 21 absorbs the surge voltage when the surge voltage not smaller than a prescribed voltage level is applied between positive bus L1 and negative bus L2, and lowers the DC voltage applied to capacitor 22 and MOS transistors Tr1 to Tr6 to a level not larger than the prescribed voltage level. Therefore, it is not necessary to secure large capacitance of capacitor 22 and large size of MOS transistors Tr1 to Tr6, considering the surge voltage. As a result, capacitor 22 and MOS transistors Tr1 to Tr6 can be reduced in size.

Capacitor 22 smoothes an input DC voltage, and supplies the smoothed DC voltage to U-phase arm 23, V-phase arm 24, and W-phase arm 25. MOS transistors Tr1 to Tr6 receive a control signal from MOS driver 27 at the gates, and are turned on/off in accordance with the received control signal. Then, MOS transistors Tr1 to Tr6 switch the direct current flowing in U-phase coil 51, V-phase coil 52, and W-phase coil 53 of alternator 50 by the DC voltage supplied from capacitor 22, so as to drive alternator 50. In addition, MOS transistors Tr1 to Tr6 convert an AC voltage generated by U-phase coil 51, V-phase coil 52, and W-phase coil 53 of alternator 50 to the DC voltage in accordance with the control signal from MOS driver 27, so as to charge battery 10.

Zener diodes DT1 to DT3 prevent application of overvoltage to MOS transistors Tr2, Tr4, Tr6 when U-phase coil 51, V-phase coil 52, and W-phase coil 53 of alternator 50 generate electric power, respectively. In other words, Zener diodes DT1 to DT3 protect the lower arm of U-phase arm 23, V-phase arm 24, and W-phase arm 25 when alternator 50 is in a power generation mode.

Power source 26 receives the DC voltage output from battery 10 through fuse FU2, and supplies the received DC voltage to MOS driver 27 as two DC voltages having different voltage levels. More specifically, power source 26 generates, for example, a DC voltage of 5V based on the DC voltage of 12V received from battery 10, and supplies to MOS driver 27 the generated DC voltage of 5V and the DC voltage of 12V received from battery 10.

MOS driver 27 is driven by the DC voltages of 5V and 12V supplied from power source 26. Then, MOS driver 27 generates a control signal for turning on/off MOS transistors Tr1 to Tr6 in synchronization with a synchronization signal from synchronous rectifier 28, and outputs the generated control signal to the gates of MOS transistors Tr1 to Tr6. More specifically, MOS driver 27 generates the control signal for turning on/off MOS transistors Tr1 to Tr6 in the power generation mode of alternator 50 based on synchronization signals SYNG1 to SYNG6 from synchronous rectifier 28, and generates the control signal for turning on/off MOS transistors Tr1 to Tr6 in a drive mode of alternator 50 based on synchronization signals SYNM1 to SYNM6 from synchronous rectifier 28.

Upon receiving a signal GS from control unit 30, synchronous rectifier 28 generates synchronization signals SYNG1 to SYNG6 based on timing signals TG1 to TG6 from control unit 29, and outputs generated synchronization signals SYNG1 to SYNG6 to MOS driver 27. In addition, upon receiving a signal MS from control unit 30, synchronous rectifier 28 generates synchronization signals SYNM1 to SYNM6 based on timing signals TM1 to TM6 from control unit 29, and outputs generated synchronization signals SYNM1 to SYNM6 to MOS driver 27.

Control unit 29 receives angles θ3, θ4, θ5 from rotation angle sensor 60, and detects the number of revolutions MRN of rotor 55 included in alternator 50 based on received angles θ3, θ4, θ5.

Angle θ3 represents an angle between a direction of magnetic force generated by U-phase coil 51 and a direction of magnetic force generated by rotor coil 54. Angle θ4 represents an angle between a direction of magnetic force generated by V-phase coil 52 and a direction of magnetic force generated by rotor coil 54. Angle θ5 represents an angle between a direction of magnetic force generated by W-phase coil 53 and a direction of magnetic force generated by rotor coil 54. Angles θ3, θ4, θ5 periodically vary in a range from 0° to 360°. Therefore, control unit 29 detects the number of times that angles θ3, θ4, θ5 periodically vary in a prescribed time period in a range from 0° to 360°, so as to obtain the number of revolutions MRN.

Then, control unit 29 detects a timing of voltages Vui, Vvi, Vwi induced in U-phase coil 51, V-phase coil 52, and W-phase coil 53 of alternator 50 based on angles θ3, θ4, θ5, and generates timing signals TG1 to TG6 indicating a timing of turn-on/off of MOS transistors Tr1 to Tr6 for converting voltages Vui, Vvi, Vwi induced in U-phase coil 51, V-phase coil 52, and W-phase coil 53 to DC voltages based on that detected timing.

In addition, control unit 29 generates timing signals TM1 to TM6 indicating a timing of turn-on/off of MOS transistors Tr1 to Tr6 for causing alternator 50 to operate as a drive motor, based on angles θ3, θ4, θ5 and the detected number of revolutions MRN.

Then, control unit 29 outputs generated timing signals TG1 to TG6, TM1 to TM6 to synchronous rectifier 28.

Control unit 30 receives signal M/G, signal RLO, and signal CHGL from an externally provided eco-run ECU (Electrical Control unit) (which will be described later). In addition, control unit 30 receives voltages Vu, Vv, Vw applied to U-phase coil 51, V-phase coil 52, and W-phase coil 53 of alternator 50.

Control unit 30 determines whether alternator 50 is to operate as a generator or a drive motor, based on signal M/G. When control unit 30 determines that alternator 50 is to operate as the generator, control unit 30 generates and outputs signal GS to synchronous rectifier 28. On the other hand, when control unit 30 determines that alternator 50 is to operate as the drive motor, control unit 30 determines a manner of current feed to U-phase coil 51, V-phase coil 52, and W-phase coil 53 based on voltages Vu, Vv, Vw, and generates signal MS for driving alternator 50 in accordance with the determined current feeding manner, for output to synchronous rectifier 28.

In addition, control unit 30 calculates a rotor current in order for alternator 50 to generate an instructed amount of electric power, based on signal RLO. Control unit 30 generates a signal RCT for feeding the calculated rotor current to rotor coil 54, and outputs the generated signal to the gate of MOS transistor 40.

Moreover, control unit 30 determines which of U-phase arm 23, V-phase arm 24, and W-phase arm 25 has failed based on signal CHGL. If any of U-phase arm 23, V-phase arm 24, and W-phase arm 25 has failed, control unit 30 stops the operation of MOS transistors Tr1 to Tr6.

MOS transistor 40 sets the rotor current supplied from battery 10 to rotor coil 54 to a prescribed value, based on signal RCT from control unit 30. Diode 41 prevents a current from flowing from node N4 to ground node GND. Here, synchronous rectifier 28 and control units 29, 30 are formed as custom IC 70.

Alternator 50 operates either as the drive motor or as the generator. Alternator 50 generates a prescribed torque under the control of control circuit 20 at the start of the engine in the drive mode where it operates as the drive motor, and starts the engine using the generated prescribed torque. Moreover, alternator 50 generates a prescribed torque under the control of control circuit 20 during a period except for start of the engine, and drives driving wheels of the vehicle incorporating generator-motor 100 with the generated prescribed torque. In addition, alternator 50 drives auxiliary machinery using the generated prescribed torque during a period except for start of the engine.

Meanwhile, alternator 50 generates an AC voltage in accordance with the rotor current flowing in rotor coil 54 in the power generation mode where it operates as the generator, and supplies the generated AC voltage to U-phase arm 23, V-phase arm 24, and W-phase arm 25.

Rotation angle sensor 60 detects angles θ3, θ4, θ5, and outputs detected angles θ3, θ4, θ5 to control unit 29.

An overall operation in generator-motor 100 will now be described. Control unit 30 determines whether alternator 50 is to operate as the generator or the drive motor, based on signal M/G from the eco-run ECU. When control unit 30 determines that alternator 50 is to operate as the generator, control unit 30 generates and outputs signal GS to synchronous rectifier 28. Control unit 30 generates signal RCT based on signal RLO from the eco-run ECU, and outputs the generated signal to the gate of MOS transistor 40.

Then, MOS transistor 40 switches the rotor current supplied from battery 10 to rotor coil 54 in response to signal RCT. Rotor 55 of alternator 50 is rotated by the rotation power of the engine. Then, alternator 50 generates a designated amount of electric power and supplies the electric power to U-phase arm 23, V-phase arm 24, and W-phase arm 25.

On the other hand, upon receiving angles θ3, θ4, θ5 from rotation angle sensor 60, control unit 29 generates timing signals TG1 to TG6, TM1 to TM6 with the method described above based on received angles θ3, θ4, θ5, and outputs the generated timing signal TG1 to TG6, TM1 to TM6 to synchronous rectifier 28.

Synchronous rectifier 28 generates synchronization signals SYNG1 to SYNG6 in synchronization with timing signals TG1 to TG6 based on signal GS from control unit 30, and outputs the same to MOS driver 27. MOS driver 27 generates the control signal for turning on/off MOS transistors Tr1 to Tr6 in synchronization with synchronization signals SYNG1 to SYNG6, and outputs the control signal to the gates of MOS transistors Tr1 to Tr6.

Then, MOS transistors Tr1 to Tr6 are turned on/off by the control signal from MOS driver 27, and converts the AC voltage generated by alternator 50 to the DC voltage, so as to charge battery 10.

Here, Zener diodes DT1 to DT3 absorb the surge voltage even if the surge voltage is superposed on the AC voltage generated by alternator 50. In other words, Zener diodes DT1 to DT3 prevent application of a voltage exceeding a withstand voltage to MOS transistors Tr2, Tr4, Tr6. In addition, Zener diode 21 absorbs the surge voltage even if the surge voltage is superposed on the DC voltage between positive bus L1 and negative bus L2. In other words, Zener diode 21 prevents application of the voltage exceeding the withstand voltage to MOS transistors Tr1, Tr3, Tr5.

When control unit 30 determines that alternator 50 is to be driven as the drive motor based on signal M/G, control unit 30 determines the manner of current feed to U-phase arm 23, V-phase arm 24, and W-phase arm 25 based on voltages Vu, Vv, Vw, and generates signal MS for driving alternator 50 in accordance with the determined current feeding manner, for output to synchronous rectifier 28.

Upon receiving angles θ3, θ4, θ5 from rotation angle sensor 60, control unit 29 generates timing signals TG1 to TG6, TM1 to TM6 with the method described above based on received angles θ3, θ4, θ5, and outputs the generated timing signal TG1 to TG6, TM1 to TM6 to synchronous rectifier 28.

Synchronous rectifier 28 generates synchronization signals SYNM1 to SYNM6 in synchronization with timing signals TM1 to TM6 based on signal MS from control unit 30, and outputs the same to MOS driver 27. MOS driver 27 generates the control signal for turning on/off MOS transistors Tr1 to Tr6 in synchronization with synchronization signals SYNM1 to SM6, and outputs the same to the gates of MOS transistors Tr1 to Tr6.

Then, MOS transistors Tr1 to Tr6 are turned on/off by the control signal from MOS driver 27, and switches the current supplied to U-phase arm 23, V-phase arm 24, and W-phase arm 25 of alternator 50 from battery 10 so as to drive alternator 50 as the drive motor. In this manner, alternator 50 supplies a prescribed torque to a crank shaft of the engine at the time of start of the engine, and supplies the prescribed torque to the driving wheels during a period except for the start of the engine. In addition, alternator 50 supplies the prescribed torque to the auxiliary machinery.

Here, Zener diode 21 absorbs the surge voltage generated between positive bus L1 and negative bus L2 by turning-on/off of MOS transistors Tr1 to Tr6. In other words, Zener diode 21 prevents application of the voltage exceeding the withstand voltage to MOS transistors Tr1, Tr3, Tr5. In addition, Zener diodes DT1 to DT3 absorb the surge voltage even if MOS transistors Tr1, Tr3, Tr5 are turned off and the surge voltage is applied to MOS transistors Tr2, Tr4, Tr6. In other words, Zener diodes DT1 to DT3 prevent application of the voltage exceeding the withstand voltage to MOS transistors Tr2, Tr4, Tr6.

As described above, MOS transistors Tr1 to Tr6 are arranged on electrode plates 81, 82A to 82C, 83 provided on the end surface of alternator 50. Such an arrangement is allowed because application of overvoltage to MOS transistors Tr1 to Tr6 is prevented and MOS transistors Tr1 to Tr6 are reduced in size by providing Zener diodes 21, DT1 to DT3. In particular, as one Zener diode 21 protects three MOS transistors Tr1, Tr3, Tr5, Zener diode 21 protecting three MOS transistors Tr1, Tr3, Tr5 can be arranged utilizing a space between substrate 84 and electrode plates 81, 83.

In addition, as Zener diode 21 also prevents application of overvoltage to capacitor 22, a capacitance of capacitor 22 can be reduced. Consequently, capacitor 22 can be arranged in a space between substrate 84 and electrode plates 81, 82C, 83.

By virtue of these factors, overall control circuit 20 is reduced in size, and control circuit 20 can be arranged on the end surface of alternator 50. In other words, control circuit 20 can be arranged in a plane perpendicular to rotation shaft 50A, instead of in the longitudinal direction of rotation shaft 50A of alternator 50. As a result, an area occupied by control circuit 20 can be reduced.

Since MOS transistors Tr1 to Tr6 are fixed to electrode plates 81, 82A to 82C with buffer material 812 being interposed, buffer material 812 being made of a material the same as that for electrode plates 81, 82A to 82C, or since a ratio of the area of MOS transistors Tr1 to Tr6 to the area of electrode plates 81, 82A to 82C is set to not smaller than 6, MOS transistors Tr1 to Tr6 can effectively be cooled.

The generator-motor according to the present invention may be a generator-motor 101 shown in FIG. 10. Referring to FIG. 10, in generator-motor 101, though MOS transistors Tr1 to Tr6 are connected to electrode plates 82A to 82C, 83 by flat electrodes 91 to 96 instead of wire bonding (W/B) in generator-motor 100 shown in FIG. 1, generator-motor 101 is otherwise the same as generator-motor 100.

Each of flat electrodes 91 to 96 is made of a copper-based material, and has a thickness in a range from 0.1 to 2.0 mm.

Flat electrode 91 connects the source of MOS transistor Tr1 to electrode plate 82A. Flat electrode 92 connects the source of MOS transistor Tr2 to electrode plate 83. Flat electrode 93 connects the source of MOS transistor Tr3 to electrode plate 82B. Flat electrode 94 connects the source of MOS transistor Tr4 to electrode plate 83. Flat electrode 95 connects the source of MOS transistor Tr5 to electrode plate 82C. Flat electrode 96 connects the source of MOS transistor Tr6 to electrode plate 83.

Figure 11A:
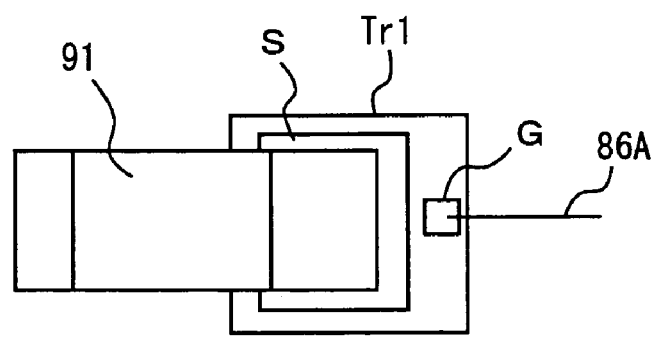
FIG. 11A is a plan view of MOS transistor Tr1 shown in FIG. 10.
Figure 11B:
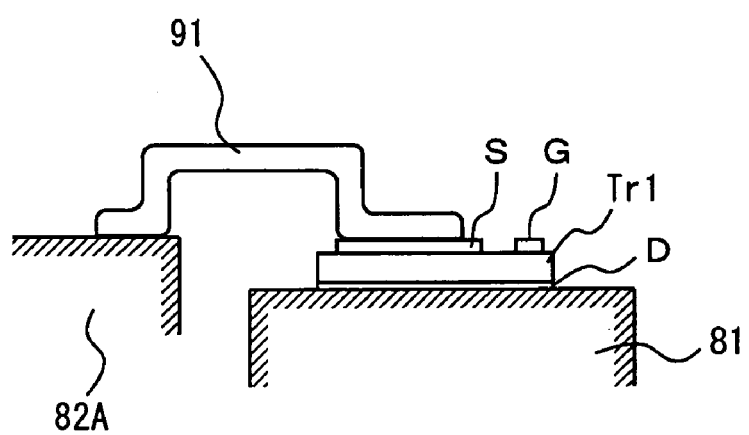
FIG. 11B is a cross-sectional view of MOS transistor Tr1 and electrode plates 81, 82A shown in FIG. 10.

FIG. 11A is a plan view of MOS transistor Tr1 shown in FIG. 10, while FIG. 11B is a cross-sectional view of MOS transistor Tr1 and electrode plates 81, 82A shown in FIG. 10. In FIGS. 11A and 11B, wire GL in FIGS. 2A and 2B is replaced with flat electrode 91, however, FIGS. 11A and 11B are otherwise the same as FIGS. 2A and 2B.

Flat electrode 91 connects source S of MOS transistor Tr1 to electrode plate 82A. Flat electrode 91 is connected to source S of MOS transistor Tr1 and to electrode plate 82A by soldering. Here, a Pb-free, Ag—Cu—Sn-based solder is employed. The solder attains thermal conductivity two times higher than a normal solder. Accordingly, heat generated in MOS transistor Tr1 can efficiently be conducted to flat electrode 91 and electrode plate 82A, and heat dissipation effect of MOS transistor Tr1 can be enhanced.

Source S is preferably composed of Al—Ni—Au. Here, aluminum (Al) is formed so as to be in contact with silicon (Si) used as a material for MOS transistor Tr1. That is, source S is fabricated by successively depositing aluminum (Al), nickel (Ni) and gold (Au) on MOS transistor Tr1 (Si). In this manner, adhesion between flat electrode 91 and source S of MOS transistor Tr1 in soldering flat electrode 91 to source S of MOS transistor Tr1 can be improved. It is noted that gate G may also be fabricated with Al—Ni—Au, in a manner similar to source S. In addition, source S and gate G may be fabricated with Al—Ni.

The solder the same as that used in connecting flat electrode 91 to source S of MOS transistor Tr1 and to electrode plate 82A is employed, also when flat electrode 92 is connected to source S of MOS transistor Tr2 and electrode plate 83, when flat electrode 93 is connected to source S of MOS transistor Tr3 and electrode plate 82B, when flat electrode 94 is connected to source S of MOS transistor Tr4 and electrode plate 83, when flat electrode 95 is connected to source S of MOS transistor Tr5 and electrode plate 82C, and when flat electrode 96 is connected to source S of MOS transistor Tr6 and electrode plate 83. Otherwise, the description in connection with FIGS. 2A and 2B is also applicable here.

MOS transistors Tr2 to Tr6 shown in FIG. 10 are also connected to electrode plates 82B, 82C, 83 by flat electrodes 92 to 96 respectively, in a manner similar to MOS transistor Tr1.

In this manner, in generator-motor 101, MOS transistors Tr1 to Tr6 are connected to electrode plates 82A, 83, 82B, 83, 82C, 83 by flat electrodes 91 to 96, respectively.

Figure 12:
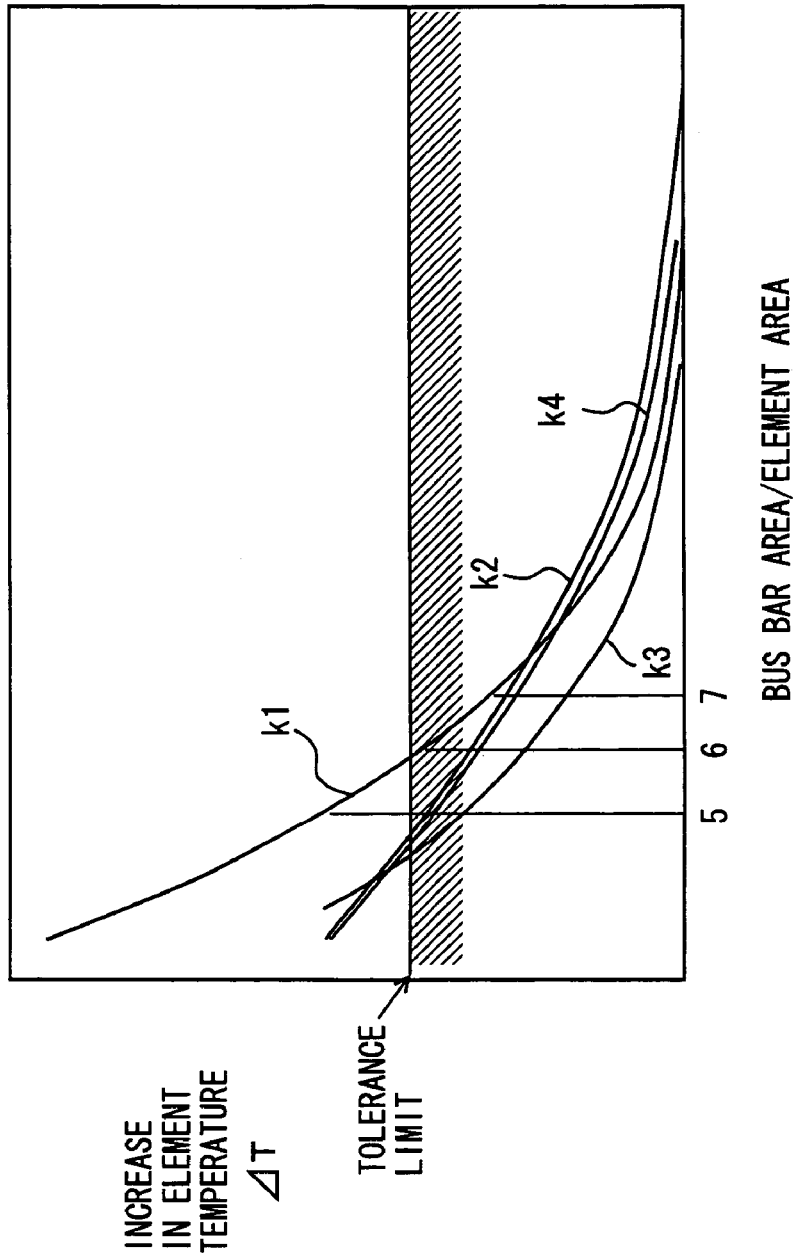
FIG. 12 shows a relation between temperature increase of MOS transistors Tr1 to Tr6 shown in FIG. 10 and bus bar area/element area.

FIG. 12 shows a relation between temperature increase of MOS transistors Tr1 to Tr6 shown in FIG. 10 and the bus bar area/element area. In FIG. 12, curves k1, k2 represent a relation between temperature increase of MOS transistors Tr1 to Tr6 and the bus bar area/element area when MOS transistors Tr1 to Tr6 are connected to electrode plates 82A, 82B, 82C, 83 through wire GL, while curves k3, k4 represent a relation between temperature increase of MOS transistors Tr1 to Tr6 and the bus bar area/element area when MOS transistors Tr1 to Tr6 are connected to electrode plates 82A, 82B, 82C, 83 through flat electrodes 91 to 96. Curve k3 represents a transition state, that is, a motor operation state, while curve k4 represents a power generation operation state. Description on curves k1, k2 has already been provided in connection with FIG. 8.

Referring to FIG. 12, by connecting MOS transistors Tr1 to Tr6 to electrode plates 82A, 82B, 82C, 83 through flat electrodes 91 to 96, temperature increase of MOS transistors Tr1 to Tr6 in the motor operation state can be reduced by approximately 35% (see curves k1, k3). In addition, temperature increase of MOS transistors Tr1 to Tr6 in the power generation operation state can be reduced by 3 to 6% (see curves k2, k4).

In an area not larger than the tolerance limit of the temperature increase in the element, the temperature increase of MOS transistors Tr1 to Tr6 is greater in the power generation operation state indicated by curve k4 than in the motor operation state indicated by curve k3. Therefore, in the present invention, when flat electrodes 91 to 96 are employed, the area of MOS transistors Tr1 to Tr6 and the area of electrode plates 81, 82A to 82C are determined such that an area ratio not smaller than an area ratio at which the temperature increase in the element indicated by curve k4 does not exceed the tolerance limit is attained. In other words, the area of MOS transistors Tr1 to Tr6 and the area of electrode plates 81, 82A to 82C are determined such that an area ratio (=bus bar area/element area) is not smaller than 5.

In this manner, heat generated in MOS transistors Tr1 to Tr6 is transmitted to electrode plates 81, 82A to 82C through buffer material 812 and flat electrodes 91 to 96, and MOS transistors Tr1 to Tr6 are cooled so that the temperature increase of MOS transistors Tr1 to Tr6 does not exceed the tolerance limit.

In this manner, when MOS transistors Tr1 to Tr6 are connected to electrode plates 82A, 83, 82B, 83, 82C, 83 by flat electrodes 91 to 96 respectively, heat generated in MOS transistors Tr1 to Tr6 is dissipated through flat electrodes 91 to 96. As a result, when MOS transistors Tr1 to Tr6 are connected to electrode plates 82A to 82C, 83 by wire bonding (W/B) as in generator-motor 100, a ratio between the area of electrode plates 81, 82A to 82C and the area of MOS transistors Tr1 to Tr6 should be set to not smaller than 6 in order to cool MOS transistors Tr1 to Tr6 so that temperature increase in MOS transistors Tr1 to Tr6 is not larger than the tolerance limit. On the other hand, when MOS transistors Tr1 to Tr6 are connected to electrode plates 82A to 82C, 83 by flat electrodes 91 to 96 respectively as in generator-motor 101, a ratio between the area of electrode plates 81, 82A to 82C and the area of MOS transistors Tr1 to Tr6 for cooling MOS transistors Tr1 to Tr6 so that temperature increase in MOS transistors Tr1 to Tr6 is not larger than the tolerance limit can be set to 5, which is smaller than 6.

Accordingly, if an area for MOS transistors Tr1 to Tr6 is constant, an area for electrode plates 81, 82A to 82C can be made smaller by connecting MOS transistors Tr1 to Tr6 to electrode plates 82A to 82C, 83 using flat electrodes 91 to 96 respectively.

Figure 13:
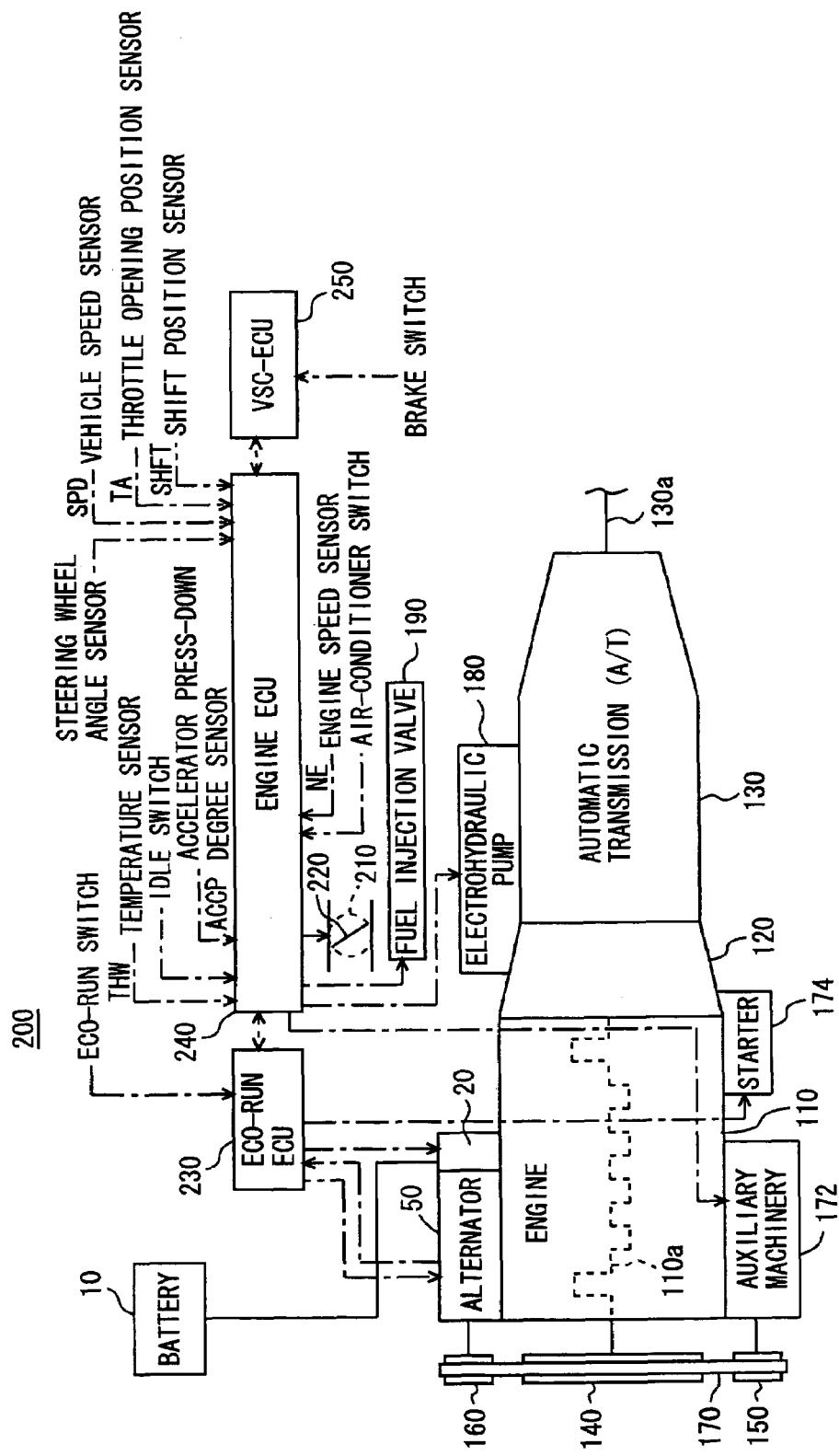
FIG. 13 is a schematic block diagram of an engine system including the generator-motor shown in FIG. 1.
Figure 14:
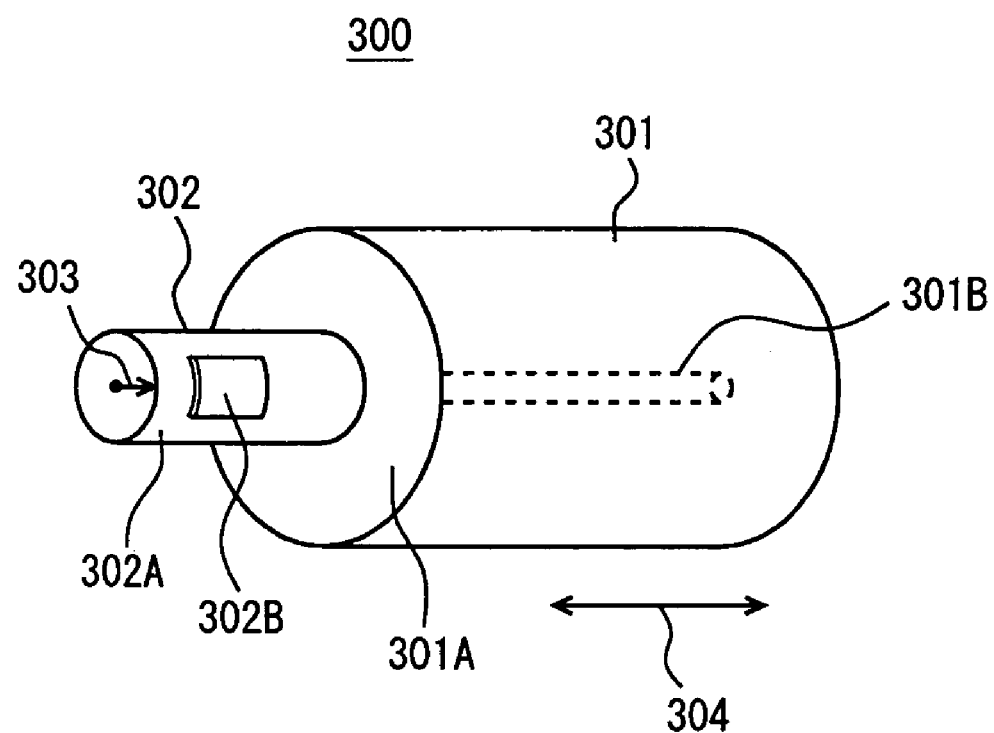
FIG. 14 is a perspective view of a conventional starter-generator.
Figure 15:
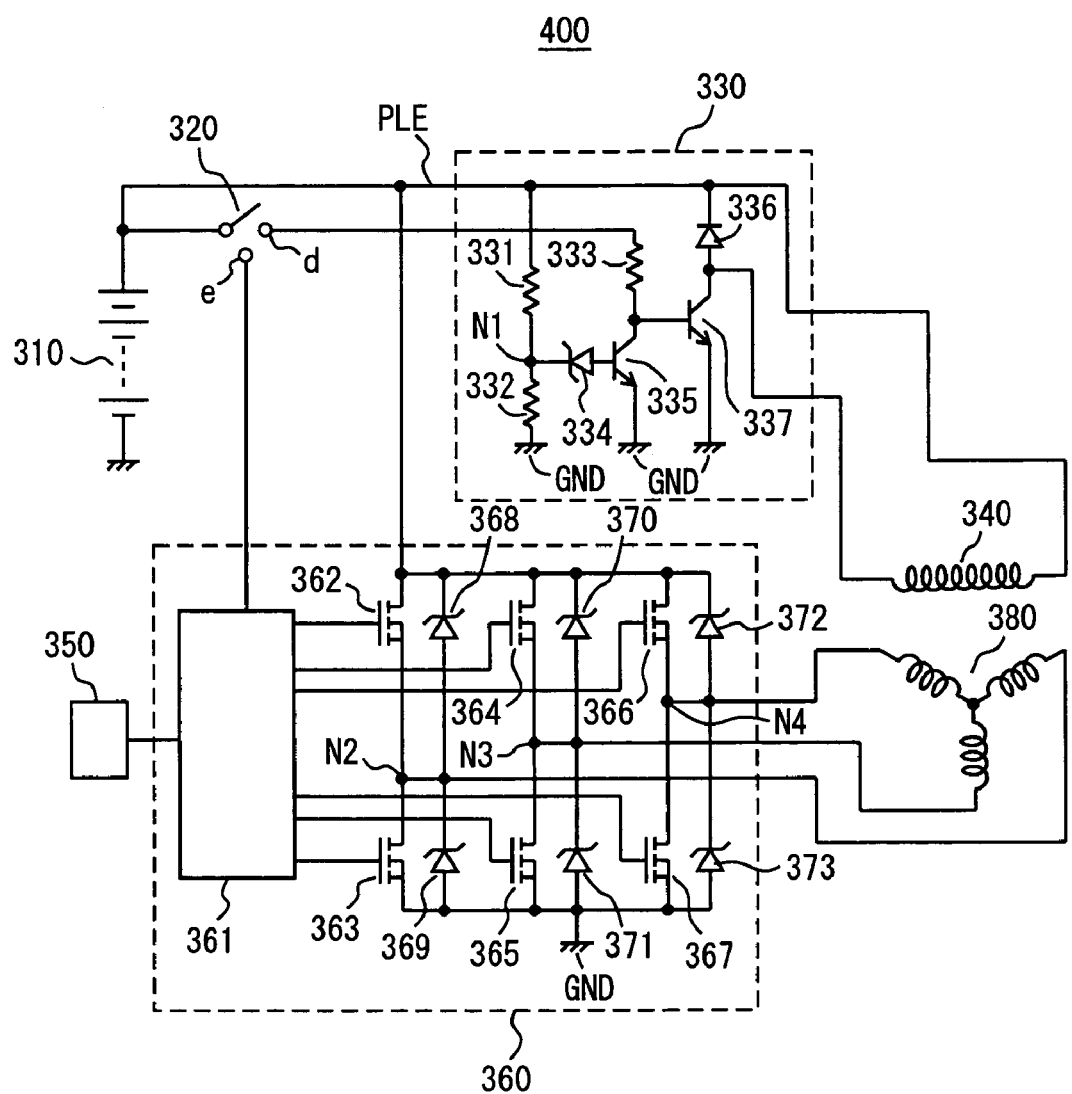
FIG. 15 is a circuit diagram of a conventional starter-charger circuit.

FIG. 13 shows a block diagram of an engine system 200 including generator-motor 100 shown in FIG. 1. Referring to FIG. 13, engine system 200 includes battery 10, control circuit 20, alternator 50, an engine 110, a torque converter 120, an automatic transmission 130, pulleys 140, 150, 160, a belt 170, auxiliary machinery 172, a starter 174, an electrohydraulic pump 180, a fuel injection valve 190, an electric motor 210, a throttle valve 220, an eco-run ECU 230, en engine ECU 240, and a VSC (Vehicle Stability Control)-ECU 250.

Alternator 50 is arranged proximate to engine 110. Control circuit 20 is arranged on the end surface of alternator 50, as described above.

Engine 110 is started by alternator 50 or starter 174, and generates a prescribed output power. More specifically, engine 110 is started by alternator 50 at a start after stop in accordance with the economy running system (also referred to as "eco-run"), while engine 110 is started by starter 174 at the time of start using an ignition key. Engine 110 provides the generated output power from a crank shaft 110a to torque converter 120 or pulley 140.

Torque converter 120 transmits rotation of engine 110 from crank shaft 110a to automatic transmission 130. Automatic transmission 130 exerts automatic transmission control, sets the torque from torque converter 120 to a torque in accordance with transmission control, and provides the torque to an output shaft 130a.

Pulley 140 is connected to crank shaft 110a of engine 110. Pulley 140 operates together with pulleys 150, 160 via belt 170.

Belt 170 links pulleys 140, 150, 160 with each other. Pulley 150 is connected to a rotation shaft of auxiliary machinery 172.

Pulley 160 is connected to the rotation shaft of alternator 50, and turned by crank shaft 110a of engine 110 or alternator 50.

Auxiliary machinery 172 is implemented by one or more of a compressor for air-conditioner, a power steering pump, and an engine-cooling water pump. Auxiliary machinery 172 receives the output power from alternator 50 through pulley 160, belt 170 and pulley 150, and is driven by the received output power.

Alternator 50 is driven by control circuit 20. Alternator 50 receives the rotation power of crank shaft 110a of engine 110 through pulley 140, belt 170 and pulley 160, and converts the received rotation power to electric energy. In other words, alternator 50 generates electric power by the rotation power of crank shaft 110a. Here, alternator 50 generates electric power in the following two cases. That is, alternator 50 generates electric power when it receives the rotation power of crank shaft 110a produced by drive of engine 110 in a normal running state of a hybrid vehicle equipped with engine system 200. In addition, though engine 110 is not driven, alternator 50 generates electric power upon receiving the rotation power transmitted to crank shaft 110a from the driving wheels in deceleration of the hybrid vehicle.

Alternator 50 is driven by control circuit 20, and outputs a prescribed output power to pulley 160. The prescribed output power is transmitted to crank shaft 110a of engine 110 through belt 170 and pulley 140 when engine 110 is started, or it is transmitted to auxiliary machinery 172 through belt 170 and pulley 150 in driving auxiliary machinery 172.

Battery 10 supplies the DC voltage of 12V to control circuit 20, as described above.

Control circuit 20 converts the DC voltage from battery 10 to the AC voltage under the control of eco-run ECU 230 as described above, and drives alternator 50 using the obtained AC voltage. In addition, control circuit 20 converts the AC voltage generated by alternator 50 to the DC voltage under the control of eco-run ECU 230, and charges battery 10 using the obtained DC voltage.

Starter 174 starts engine 110 under the control of eco-run ECU 230. Electrohydraulic pump 180 is contained in automatic transmission 130, and supplies a hydraulic fluid to a hydraulic control unit provided in automatic transmission 130 under the control of engine ECU 240. The hydraulic fluid serves to adjust an actuation state of a clutch, a brake and a one-way clutch within automatic transmission 130 by means of a control valve in the hydraulic control unit, so as to switch a shift state as required.

Eco-run ECU 230 serves for mode control of alternator 50 and control circuit 20, control of starter 174, and control of an amount of power storage in battery 10. Here, the mode control of alternator 50 and control circuit 20 refers to control of the power generation mode in which alternator 50 attains a function as the generator and the drive mode in which alternator 50 attains a function as the drive motor. Here, a control line from eco-run ECU 230 to battery 10 is not shown.

In addition, eco-run ECU 230 detects the number of revolutions MRN based on angles θ1, θ2, θ3 from rotation angle sensor 60 contained in alternator 50, whether or not the eco-run system has been started by a driver through an eco-run switch, and other data.

Fuel injection valve 190 controls injection of a fuel under the control of engine ECU 240. Electric motor 210 controls an opening position of throttle valve 220 under the control of engine ECU 240. Throttle valve 220 is set to a prescribed opening position by electric motor 210.

Engine ECU 240 serves for control of turn-on/off of auxiliary machinery 172 except for the engine-cooling water pump, control of drive of electrohydraulic pump 180, transmission control of automatic transmission 130, control of injection of a fuel by fuel injection valve 190, control of the opening position of throttle valve 220 by electric motor 210, and other engine control.

In addition, engine ECU 240 detects a temperature of engine-cooling water from a temperature sensor, whether or not an accelerator pedal has been pressed down from an idle switch, a degree of press-down of the accelerator from an accelerator press-down degree sensor, a steering wheel angle from a steering wheel angle sensor, a vehicle speed from a vehicle speed sensor, a throttle opening position from a throttle opening position sensor, a shift position from a shift position sensor, the number of revolutions of the engine from an engine speed sensor, whether or not an operation to turn on/off of the air-conditioner has been performed from a switch of the air-conditioner, and other data.

VSC-ECU 250 detects whether or not a brake pedal has been pressed down from a brake switch, and other data.

Eco-run ECU 230, engine ECU 240 and VSC-ECU 250 mainly include a microcomputer, in which a CPU (Central Processing Unit) executes a necessary operation in accordance with a program written in an internal ROM (Read Only Memory) and a variety of types of control are applied based on a result of the operation. The result of the operation and detected data can be communicated as data, among eco-run ECU 230, engine ECU 240 and VSC-ECU 250. Therefore, the data can be exchanged as required, and control can be applied in a cooperative manner.

Engine system 200 should operate so as to exert already-known idle stop control. More specifically, the engine is stopped by detecting deceleration or stop of the vehicle based on outputs from a variety of sensors, and the engine is started by alternator 50 when the driver intends start (such an intention can be detected based on a status of operation of the brake or the accelerator pedal). In engine system 200, control circuit 20 controlling alternator 50 is provided on the end surface of alternator 50, and drives alternator 50 as the drive motor or as the generator in accordance with the instruction from eco-run ECU 230. In driving alternator 50 as the drive motor or as the generator, heat generated by MOS transistors Tr1 to Tr6 in control circuit 20 is transmitted to electrode plates 81, 82A to 82C through buffer material 812, so that MOS transistors Tr1 to Tr6 are effectively cooled.

Here, it goes without saying that generator-motor 101 is applicable to engine system 200.

In the present invention, alternator 50 includes the stator and the rotor, and implements a "motor" attaining a function as the motor-generator.

In addition, in the present invention, electrode plates 81, 82A to 82C, 83 implement "bus bars".

Moreover, in the present invention, electrode plate 81 implements a "first bus bar," electrode plates 82A to 82C implement "second bus bars," and electrode plate 83 implements a "third bus bar."

Furthermore, in the present invention, MOS driver 27, synchronous rectifier 28 and control units 29, 30 constitute an "electronic control unit."

In the present invention, MOS transistor 40 implements a "field coil control unit" controlling current feed to the field coil different from the stator.

In addition, in the present invention, MOS transistors Tr1 to Tr6 constitute a "polyphase switching element group" controlling a current to be fed to the stator.

Furthermore, in the present invention, wires 86A to 86F constitute a "leadframe" extending from substrate 84 (implemented by a ceramic substrate) to electrode plates 81, 82A to 82C, 83.

In the generator-motor according to the present invention, a ratio between the element area and the bus bar area (bus bar area/element area) should be set to not smaller than 5.

According to the embodiment of the present invention, in the generator-motor, the plurality of switching elements controlling a current to be fed to the coil of the alternator attaining the function as the generator and the drive motor are fixed to the electrode plate with the buffer material being interposed, the buffer material being made of the material the same as that for the electrode plate to which the plurality of switching elements are fixed. Therefore, the plurality of switching elements can effectively be cooled.

In addition, according to the embodiment of the present invention, in the generator-motor, the ratio of the area of the electrode plate to which the plurality of switching elements are fixed to the area of each of the plurality of switching elements controlling the current to be fed to the coil of the alternator attaining the function as the generator and the drive motor has been set to not smaller than 5. Accordingly, the plurality of switching elements can effectively be cooled.

Moreover, according to the embodiment of the present invention, the control circuit controlling drive of the alternator attaining the function as the generator or the motor includes the plurality of switching elements and one Zener diode preventing application of the surge voltage to the plurality of switching elements. Accordingly, a total size of the control circuit can be made smaller. Consequently, the control circuit can be provided on the end surface of the alternator.

Furthermore, according to the embodiment of the present invention, the generator-motor includes a polyphase switching element group controlling the current to be fed to the coil of the alternator attaining the function as the generator or the motor, a control circuit controlling the polyphase switching element group, and two electrode plates provided so as to substantially form a U-shape to surround the rotation shaft of the alternator. The control circuit is provided on the ceramic substrate arranged in the inplane direction of the two electrode plates in the substantially U-shaped notch. Accordingly, the area occupied by the control circuit can be reduced, and consequently, the generator-motor can be reduced in size.

In the present embodiment, though the eco-run ECU and the engine ECU have separately been provided, one engine control ECU can be implemented by integrating their functions. Moreover, the transmission in the present embodiment is not limited to AT (what is called an automatic transmission), and it can be implemented by a combination of known transmissions such as a CVT and an MT.

Furthermore, the present embodiment is applicable to a hybrid vehicle in which the motor is able to generate a large driving force in spite of being adapted to the eco-run system. The present invention can be achieved even if alternator 50 is replaced by another well-known generator-motor (also referred to as the motor-generator). That is, a generator-motor capable of applying a torque necessary for driving the vehicle or starting the engine should only be selected as appropriate.

Although the present invention has been described and illustrated in detail, it is clearly understood that the same is by way of illustration and example only and is not to be taken by way of limitation, the spirit and scope of the present invention being limited only by the terms of the appended claims.

INDUSTRIAL APPLICABILITY

The present invention is applicable to a generator-motor that can be reduced in size.

The invention claimed is:

1. A generator-motor, comprising:
   a motor including a plurality of coils provided corresponding to a plurality of phases and attaining a function as a motor-generator; and
   a control circuit controlling said motor; wherein
   said control circuit includes
   a plurality of arms provided corresponding to said plurality of coils respectively and connected in parallel between a positive bus and a negative bus, and
   a first Zener diode connected in parallel to said plurality of arms, between said positive bus and said negative bus, and
   each of said plurality of arms includes
   first and second switching elements connected in series between said positive bus and said negative bus, and
   a second Zener diode connected in parallel to said second switching element, between said first switching element and said negative bus.

2. The generator-motor according to claim 1, wherein said control circuit is provided in a manner integrated with said motor.

3. The generator-motor according to claim 1, wherein said motor starts an engine mounted on a vehicle or generates electric power by a rotation force of said engine.

4. The generator-motor according to claim 1, further comprising an electronic control unit outputting a control signal to a plurality of first and second switching elements included in said control circuit, wherein
   said first Zener diode is arranged in vicinity of said electronic control unit.

5. The generator-motor according to claim 1, further comprising a fuse provided closer to a DC power source than to a positive-side connecting position of said first Zener diode.

* * * * *